United States Patent
Lee et al.

(10) Patent No.: US 11,431,531 B2
(45) Date of Patent: Aug. 30, 2022

(54) TERMINATION FOR HIGH-FREQUENCY TRANSMISSION LINES

(71) Applicant: QUALCOMM Incorporated, San Diego, CA (US)

(72) Inventors: Chulkyu Lee, San Diego, CA (US); Hyunjeong Park, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/197,335

(22) Filed: Mar. 10, 2021

(65) Prior Publication Data
US 2021/0297293 A1 Sep. 23, 2021

Related U.S. Application Data

(60) Provisional application No. 62/991,437, filed on Mar. 18, 2020.

(51) Int. Cl.
*H04L 25/02* (2006.01)
*G06F 13/40* (2006.01)
*H04L 25/03* (2006.01)

(52) U.S. Cl.
CPC ...... *H04L 25/0298* (2013.01); *G06F 13/4086* (2013.01); *H04L 25/0272* (2013.01); *H04L 25/0292* (2013.01); *H04L 25/03878* (2013.01)

(58) Field of Classification Search
CPC .......... H04L 25/0298; H04L 25/0272; H04L 25/0292; H04L 25/03878; G06F 13/4086; H04B 3/14; H03H 7/383
(Continued)

(56) References Cited

U.S. PATENT DOCUMENTS

| 5,955,911 A | 9/1999 | Drost et al. |
| 6,642,741 B2 | 11/2003 | Metz et al. |

(Continued)

FOREIGN PATENT DOCUMENTS

| CN | 204376383 U | 6/2015 |
| WO | 2016086984 A1 | 6/2016 |
| WO | 2016209559 A1 | 12/2016 |

OTHER PUBLICATIONS

Cheung P., "Practical Digital Design: I/O Interfacing", Topic 7, E3.05 Digital System Design, Feb. 8, 2008, 9 pages.

(Continued)

*Primary Examiner* — Don P Le
(74) *Attorney, Agent, or Firm* — Loza & Loza, LLP

(57) ABSTRACT

A termination for a high-frequency transmission line includes a first resistor that has a first terminal coupled to a first end of a transmission line and a second terminal coupled to a first input/output pad, and a second resistor that has a first terminal coupled to the first input/output pad. The first resistor and the second resistor may provide a combined resistance that matches a nominal value of a characteristic impedance of the transmission line. The apparatus may include a third resistor having a first terminal coupled to a second end of a transmission line, and a second terminal coupled to a second input/output pad, and a fourth resistor having a first terminal coupled to the second input/output pad. The third resistor and the fourth resistor may provide a combined resistance that matches the nominal value of the characteristic impedance of the transmission line.

25 Claims, 18 Drawing Sheets

$R = RS_1 = RS_2 = RL_1 = RL_2 = 25 \text{ ohm}$

(58) Field of Classification Search
USPC .......................................................... 326/30
See application file for complete search history.

(56) References Cited

U.S. PATENT DOCUMENTS

| | | |
|---|---|---|
| 7,205,787 B1 | 4/2007 | Massoumi et al. |
| 7,245,154 B1* | 7/2007 | Davidson ......... H03K 19/00346 326/82 |
| 8,436,642 B1* | 5/2013 | Kireev ................ G06F 13/4086 326/38 |
| 8,570,064 B1 | 10/2013 | Chan et al. |
| 9,966,908 B1 | 5/2018 | Carey |
| 10,284,394 B1 | 5/2019 | Forey et al. |
| 10,454,725 B1 | 10/2019 | Lee et al. |
| 2006/0119380 A1* | 6/2006 | Gonzalez ............ H04L 25/0278 326/30 |
| 2010/0066404 A1* | 3/2010 | Zhang ............ H03K 19/017545 326/30 |
| 2015/0149678 A1 | 5/2015 | Kim |

OTHER PUBLICATIONS

Rao B.P.A., et al., "Overview of Differential—ended I/O Logic Families", International Journal of Engineering Research & Technology (IJERT), vol. 6, No. 11, Nov. 2017, pp. 407-412.
International Search Report and Written Opinion—PCT/US2021/022833—ISA/EPO—dated Jun. 29, 2021.

* cited by examiner

1400

$C = C_{ptx} = C_{prx} = 1.5$ pF

| Frequency | $X_C$ | $R \parallel X_C$ | $R_{term}$ | r |
|---|---|---|---|---|
| 1 Mhz | 106157.11 | 24.99 | 49.99 | 0.00 |
| 100 Mhz | 1061.57 | 24.42 | 49.42 | 0.01 |
| 1 Ghz | 106.16 | 20.23 | 45.23 | 0.05 |
| 2 Ghz | 53.08 | 17.00 | 42.00 | 0.09 |
| 3 Ghz | 35.39 | 14.65 | 39.65 | 0.12 |
| 4 Ghz | 26.54 | 12.87 | 37.87 | 0.14 |
| 5 Ghz | 21.23 | 11.48 | 36.48 | 0.16 |

1402   1404

1420

$C = C_{ptx} = C_{prx} = 1.0$ pF

| Frequency | $X_C$ | $R \parallel X_C$ | $R_{term}$ | r |
|---|---|---|---|---|
| 1 Mhz | 159235.67 | 25.00 | 50.00 | 0.00 |
| 100 Mhz | 1592.36 | 24.61 | 49.61 | 0.00 |
| 1 Ghz | 159.24 | 21.61 | 46.61 | 0.04 |
| 2 Ghz | 79.62 | 19.03 | 44.03 | 0.06 |
| 3 Ghz | 53.-8 | 17.00 | 42.00 | 0.09 |
| 4 Ghz | 39.81 | 15.36 | 40.36 | 0.11 |
| 5 Ghz | 31.85 | 14.01 | 39.01 | 0.12 |

TERMINATION FOR HIGH-FREQUENCY TRANSMISSION LINES

PRIORITY

This application claims priority to and the benefit of U.S. Provisional Patent Application Ser. No. 62/991,437 filed in the U.S. Patent Office on Mar. 18, 2020, the entire content of this application being incorporated herein by reference as if fully set forth below in its entirety and for all applicable purposes.

TECHNICAL FIELD

The present disclosure relates generally to high-speed data links and, more particularly, to terminating high-frequency transmission lines.

BACKGROUND

Mobile communication devices may include a variety of components including circuit boards, integrated circuit (IC) devices and/or System-on-Chip (SoC) devices. The components may include processing devices, user interface components, storage and other peripheral components that communicate through a shared data communication bus, which may include a multi-drop serial bus or a parallel bus.

General-purpose serial interfaces known in the industry include the Inter-Integrated Circuit (I2C or I$^2$C) serial interface and its derivatives and alternatives. An I2C interface may provide bandwidth measurable in kilobits per second (Kbps). Multimedia standards such as standards and specifications defined by the Mobile Industry Processor Interface (MIPI) Alliance including the Display System Interface (DSI) and DigRF, and standards defined by Electronic Industries Alliance (EIA) and/or the Consumer Electronics Association (CEA) including High-Definition Multimedia Interface (HDMI), and standards defined by the Video Electronics Standards Association (VESA) including DisplayPort.

The MIPI Alliance defines standards for the Improved Inter-Integrated Circuit (I3C) serial interface, the Radio Frequency Front-End (RFFE) interface, the System Power Management Interface (SPMI) and other interfaces, including the C-PHY, D-PHY, M-PHY interfaces. These interface standards may be used to connect processors, sensors and other peripherals, for example. In some configurations, multiple bus masters are coupled to the serial bus such that two or more devices can serve as bus master for different types of messages transmitted on the serial bus. The RFFE interface standard defines communication protocols that can be used for controlling various radio frequency (RF) front-end devices, including power amplifier (PA), low-noise amplifiers (LNAs), antenna tuners, filters, sensors, power management devices, switches, etc. These devices may be collocated in a single IC device or located in multiple IC devices. In a mobile communication device, multiple antennas and radio transceivers may support multiple concurrent RF links. SPMI protocols define a hardware interface that may be implemented between baseband or application processors and peripheral components. In some examples, SPMI protocols are implemented to support power management operations within a device.

Improved physical interfaces are needed to support the implementation of higher-speed, more complex applications, which drive the demand for ever-increasing performance from multi-drop serial buses.

SUMMARY

Certain aspects of the disclosure relate to systems, apparatus, methods and techniques that can be used to terminate transmission lines. Terminations are disclosed that can reduce impedance mismatches, minimize interference arising from reflections and improve transmitter and receiver performance.

In various aspects of the disclosure, an apparatus includes a first resistor having a first terminal coupled to an end of a first transmission line, and a second terminal coupled to a first input/output pad, and a second resistor having a first terminal coupled to the first input/output pad. The first resistor and the second resistor may be selected to provide a combined resistance that matches a nominal value of a characteristic impedance of the first transmission line.

In one aspect, the apparatus includes a receiving circuit that has an input coupled to the first input/output pad. A second terminal of the second resistor may be coupled to circuit ground or a common mode voltage level. In one aspect, the apparatus includes a line driving circuit having an output coupled to the second terminal of the second resistor.

In one aspect, the second resistor and the first input/output pad are provided on an IC device, and the first resistor and the end of the first transmission line are located external to the integrated circuit device.

In certain aspects, the first resistor and the second resistor form a voltage divider with the first input/output pad at the output of the voltage divider. Signals received at the first input/output pad are attenuated representations of signals received at the end of the first transmission line. Reflections from the first input/output pad that are conducted to the end of the first transmission line may be attenuated by the first resistor. A continuous time linear equalizer may be coupled to the first input/output pad. The first resistor and the second resistor may be configured as a frequency response linearizing terminating circuit.

In certain aspects, the apparatus includes a third resistor having a first terminal coupled to an end of a second transmission line, and a second terminal coupled to a second input/output pad. The apparatus may include a fourth resistor having a first terminal coupled to the second input/output pad and a second terminal coupled to a second terminal of the second resistor. The third resistor and the fourth resistor may provide a combined resistance that matches the nominal value of the characteristic impedance of the second transmission line. The first input/output pad and the second input/output pad may be coupled to differential inputs of a receiver circuit. The first input/output pad and the second input/output pad may be coupled through corresponding resistors to differential outputs of a driving circuit.

In various aspects of the disclosure, a system has a data communication link comprising a first transmission line, a first integrated circuit device coupled to a first end of the data communication link through a first terminating circuit, and a second integrated circuit device coupled to a second end of the data communication link through a second terminating circuit. The first terminating circuit may include a first resistor having a first terminal coupled to a first end of the first transmission line, and a second terminal coupled to a first input/output pad. The first terminating circuit may include a second resistor having a first terminal coupled to the first input/output pad and a receiving circuit having a first input coupled to the first input/output pad. A second terminal of the second resistor is coupled to circuit ground or a common mode voltage level. The first resistor and the second resistor may provide a combined resistance that matches a nominal value of a characteristic impedance of the first transmission line.

In various aspects of the disclosure, a method of terminating transmission lines includes coupling a first terminal of a first resistor to an end of a first transmission line and coupling a second terminal of the first resistor to a first input/output pad. A first terminal of a second resistor may be coupled to the first input/output pad. The first resistor and the second resistor may provide a combined resistance that matches a nominal value of a characteristic impedance of the first transmission line.

BRIEF DESCRIPTION OF THE DRAWINGS

FIG. 14 includes tables that illustrate voltage reflection coefficients when terminating circuits are configured in accordance with certain aspects of this disclosure.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Examples of Apparatus that Employ Serial Data Links

According to certain aspects, a serial data link may be used to interconnect electronic devices that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, or any other similar functioning device.

Figure 1:
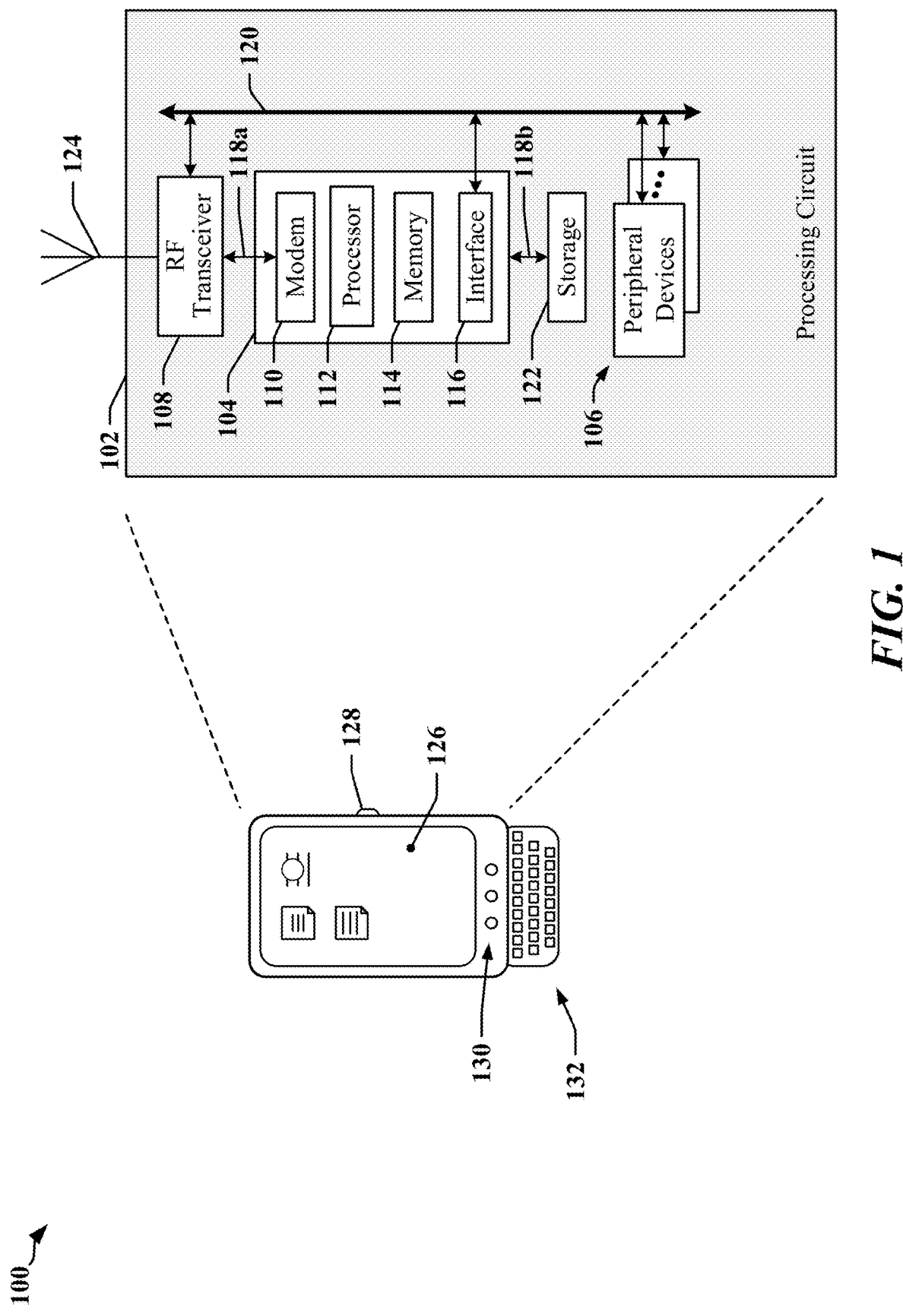
FIG. 1 illustrates an apparatus employing a data link between IC devices that is selectively operated according to one of plurality of available standards.

FIG. 1 illustrates an example of an apparatus 100 that may employ a data communication bus. The apparatus 100 may include a processing circuit 102 having multiple circuits or devices 104, 106 and/or 108, which may be implemented in one or more ASIC devices or in a System-on-chip (SoC) device. In one example, the apparatus 100 may be configured for use as a communication device and the processing circuit 102 may include a processing device provided in an ASIC 104, one or more peripheral devices 106, and a transceiver 108 that enables the apparatus to communicate through an antenna 124 with a radio access network, a core access network, the Internet and/or another network.

The ASIC 104 may have one or more processors 112, one or more modems 110, on-board memory 114, a bus interface circuit 116 and/or other logic circuits or functions. The processing circuit 102 may be controlled by an operating system that provides an application programming interface (API) layer that enables the one or more processors 112 to execute software modules residing in the on-board memory 114 or other processor-readable storage 122 provided on the processing circuit 102. The software modules may include instructions and data stored in the on-board memory 114 or processor-readable storage 122. The ASIC 104 may access its on-board memory 114, the processor-readable storage 122, and/or storage external to the processing circuit 102. The on-board memory 114, the processor-readable storage 122 may include read-only memory (ROM) or random-access memory (RAM), electrically erasable programmable ROM (EEPROM), flash cards, or any memory device that can be used in processing systems and computing platforms. The processing circuit 102 may include, implement, or have access to a local database or other parameter storage that can maintain operational parameters and other information used to configure and operate the apparatus 100 and/or the processing circuit 102. The local database may be implemented using registers, a database module, flash memory, magnetic media, EEPROM, soft or hard disk, or the like. The processing circuit 102 may also be operably coupled to external devices such as the antenna 124, a display 126, operator controls, such as switches or buttons 128, 130 and/or an integrated or external keypad 132, among other components. A user interface module may be configured to operate with the display 126, external keypad 132, etc. through a dedicated communication link or through one or more serial data interconnects.

The processing circuit 102 may include or be coupled to one or more buses 118a, 118b, 120 that enable certain devices 104, 106, and/or 108 to exchange messages and other information. In one example, the ASIC 104 may have a bus interface circuit 116 that includes a combination of circuits, counters, timers, control logic and other configurable circuits or modules. In one example, the bus interface circuit 116 may be configured to operate in accordance with communication specifications or protocols. The processing circuit 102 may include or control a power management function that configures and manages the operation of the apparatus 100.

Figure 2:
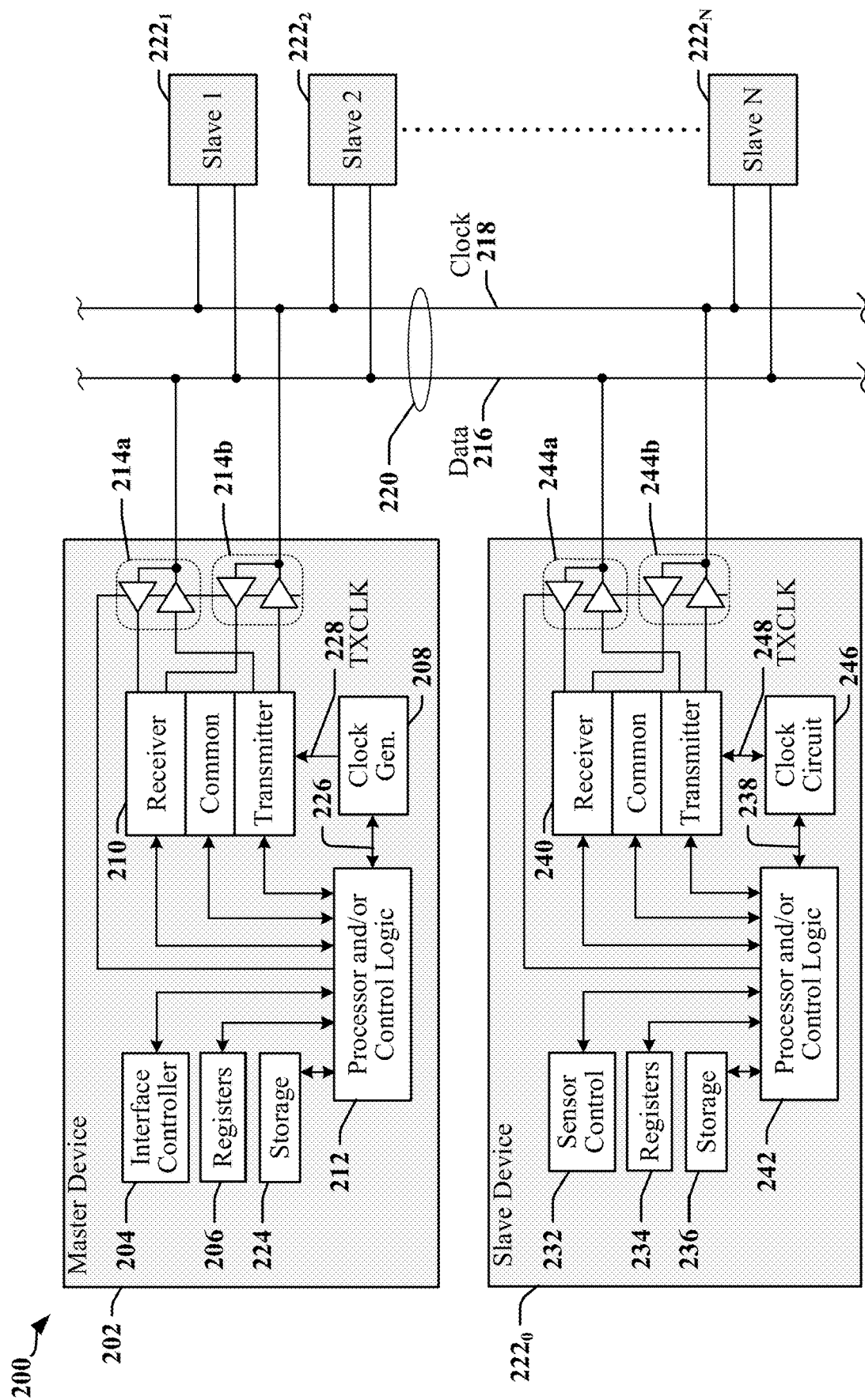
FIG. 2 illustrates a system architecture for an apparatus employing a data link between IC devices.

FIG. 2 illustrates certain aspects of an apparatus 200 that includes multiple devices 202, and $222_0$-$222_N$ coupled to a serial bus 220. The devices 202 and $222_0$-$222_N$ may be implemented in one or more semiconductor IC devices, such as an application processor, SoC or ASIC. In various implementations the devices 202 and $222_0$-$222_N$ may include, support or operate as a modem, a signal processing device, a display driver, a camera, a user interface, a sensor, a sensor controller, a media player, a transceiver, RFFE devices, and/or other such components or devices. In some examples, one or more of the slave devices $222_0$-$222_N$ may be used to control, manage or monitor a sensor device. Communication between devices 202 and $222_0$-$222_N$ over the serial bus 220 is controlled by a bus master 202. Certain types of bus can support multiple bus masters 202.

In one example, a master device 202 may include an interface controller 204 that manages access to the serial bus, configures dynamic addresses for slave devices $222_0$-$222_N$ and/or causes a clock signal 228 to be transmitted on a clock line 218 of the serial bus 220. The master device 202 may include configuration registers 206 or other storage 224, and other control logic 212 configured to handle protocols and/or higher level functions. The control logic 212 may include a processing circuit such as a state machine, sequencer, signal processor or general-purpose processor. The master device 202 includes a transceiver 210 and line drivers/receivers 214a and 214b. The transceiver 210 may include receiver, transmitter and common circuits, where the common circuits may include timing, logic and storage circuits and/or devices. In one example, the transmitter encodes and transmits data based on timing in the clock signal 228 provided by a clock generation circuit 208. Other timing clocks 226 may be used by the control logic 212 and other functions, circuits or modules.

At least one device $222_0$-$222_N$ may be configured to operate as a slave device on the serial bus 220 and may include circuits and modules that support a display, an image sensor, and/or circuits and modules that control and communicate with one or more sensors that measure environmental conditions. In one example, a slave device $222o$ configured to operate as a slave device may provide a control function, module or circuit 232 that includes circuits and modules to support a display, an image sensor, and/or circuits and modules that control and communicate with one or more sensors that measure environmental conditions. The slave device $222o$ may include configuration registers 234 or other storage 236, control logic 242, a transceiver 240 and line drivers/receivers 244a and 244b. The control logic 242 may include a processing circuit such as a state machine, sequencer, signal processor or general-purpose processor. The transceiver 210 may include receiver, transmitter and common circuits, where the common circuits may include timing, logic and storage circuits and/or devices. In one example, the transmitter encodes and transmits data based on timing in a clock signal 248 provided by clock generation and/or recovery circuits 246. The clock signal 248 may be derived from a signal received from the clock line 218. Other timing clock signals 238 may be used by the control logic 242 and other functions, circuits or modules.

The serial bus 220 may be operated in accordance with an I2C, I3C, RFFE, SPMI, C-PHY, D-PHY protocol or another suitable protocol. At least one device 202, $222_0$-$222_N$ may be configured to selectively operate as either a master device or a slave device on the serial bus 220. Two or more devices 202, $222_0$-$222_N$ may be configurable to operate as a master device on the serial bus 220.

In one example, the serial bus 220 may be operated in accordance with an I3C protocol. Devices that communicate using the I3C protocol can coexist on the same serial bus 220 with devices that communicate using I2C protocols. The I3C protocols may support different communication modes, including a single data rate (SDR) mode that is compatible with I2C protocols. High-data-rate (HDR) modes may provide a data transfer rate between 6 megabits per second (Mbps) and 16 Mbps, and some HDR modes may be provide higher data transfer rates. I2C protocols may conform to de facto I2C standards providing for data rates that may range between 100 kilobits per second (kbps) and 3.2 Mbps. I2C and I3C protocols may define electrical and timing aspects for signals transmitted on the 2-wire serial bus 220, in addition to data formats and aspects of bus control. In some aspects, the I2C and I3C protocols may define direct current (DC) characteristics affecting certain signal levels associated with the serial bus 220, and/or alternating current (AC) characteristics affecting certain timing aspects of signals transmitted on the serial bus 220. In some examples, a 2-wire serial bus 220 transmits data on a data line 216 and a clock signal on the clock line 218. In some instances, data may be encoded in the signaling state, or transitions in signaling state of the data line 216 and the clock line 218.

Figure 3:
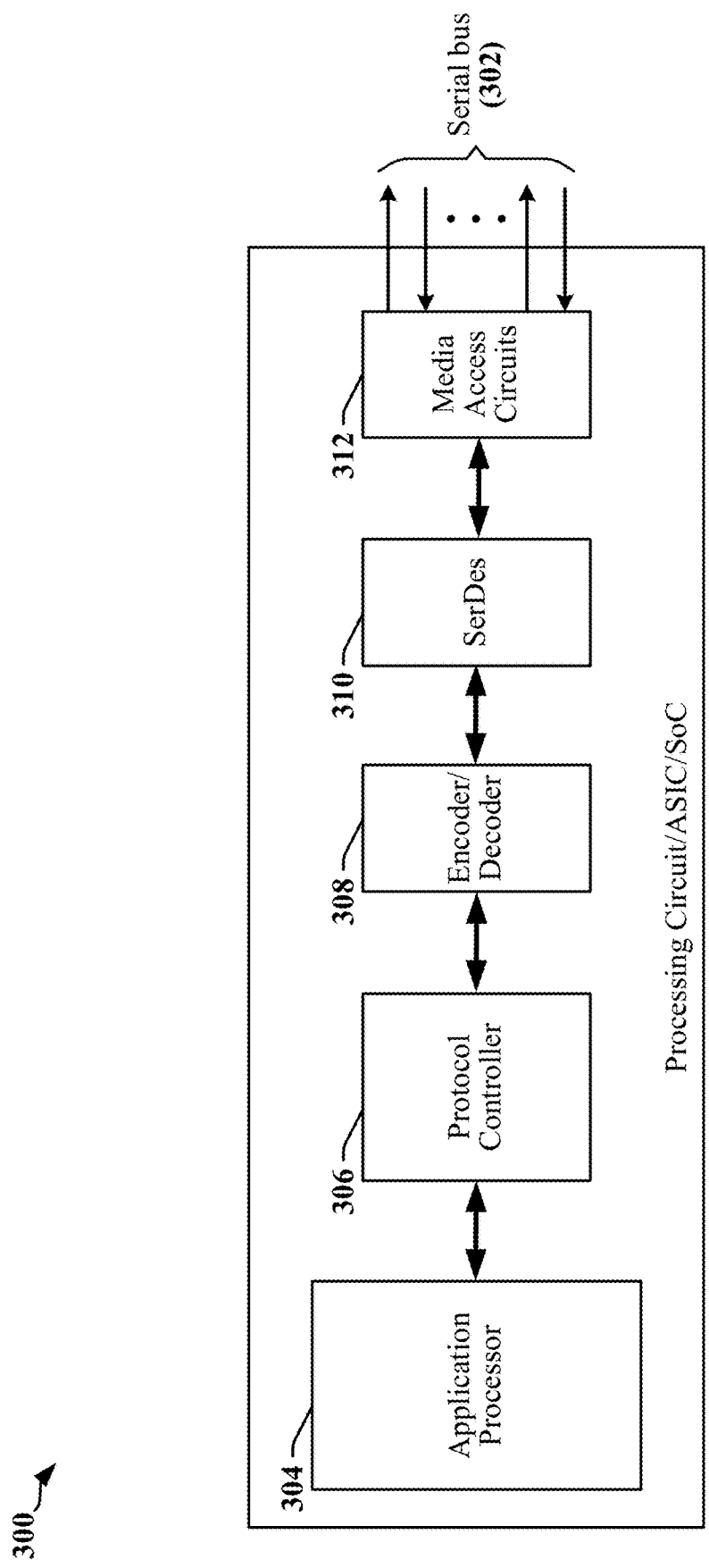
FIG. 3 illustrates an example of a device that may be coupled to one or more links, lanes or buses in accordance with certain aspects disclosed herein.

FIG. 3 illustrates an example of a device 300 adapted for connection to one or more links or lanes of a serial bus 302. The device 300 may be implemented as a processing circuit and/or as an ASIC or SoC. An application processor 304 may serve as a data source and/or data sink. The application processor 304 may include or be coupled to a protocol controller 306 that is configured to format data and commands in accordance with a desired or selected communications protocol. In one example, the protocol controller 306 may be configured to generate datagrams that are formatted in accordance with the desired or selected communications protocol. The protocol controller 306 may include or be implemented using a microprocessor, a microcontroller, a sequencer, a state machine or some other processing device. In certain examples, the protocol controller 306 may be configured to encode data in messages to be sent in accordance with an I3C, D-PHY, M-PHY, C-PHY, RFFE, SPMI or other protocol.

In some implementations, the protocol controller 306 includes or cooperates with an encoder/decoder 308 that receives data generated using the application processor 304, and encodes the data for transmission on the serial bus 302. The encoder/decoder 308 may receive data from the serial bus 302 and provide decoded information for delivery to the application processor 304. Serializer/deserializer circuits (e.g., the SERDES circuit 310) and media access circuits 312 convert data to bitstreams for transmission in accordance with signaling specifications defined for the serial bus 302. The SERDES circuit 310 and the media access circuits 312 convert bitstreams from signals received from the serial bus 302 to data that can be decoded and provided for processing by the application processor 304. The media access circuits 312 may include transceivers, clock generators, clock recovery circuits phase-locked loop (PLL) circuits, and the like.

Figure 4:
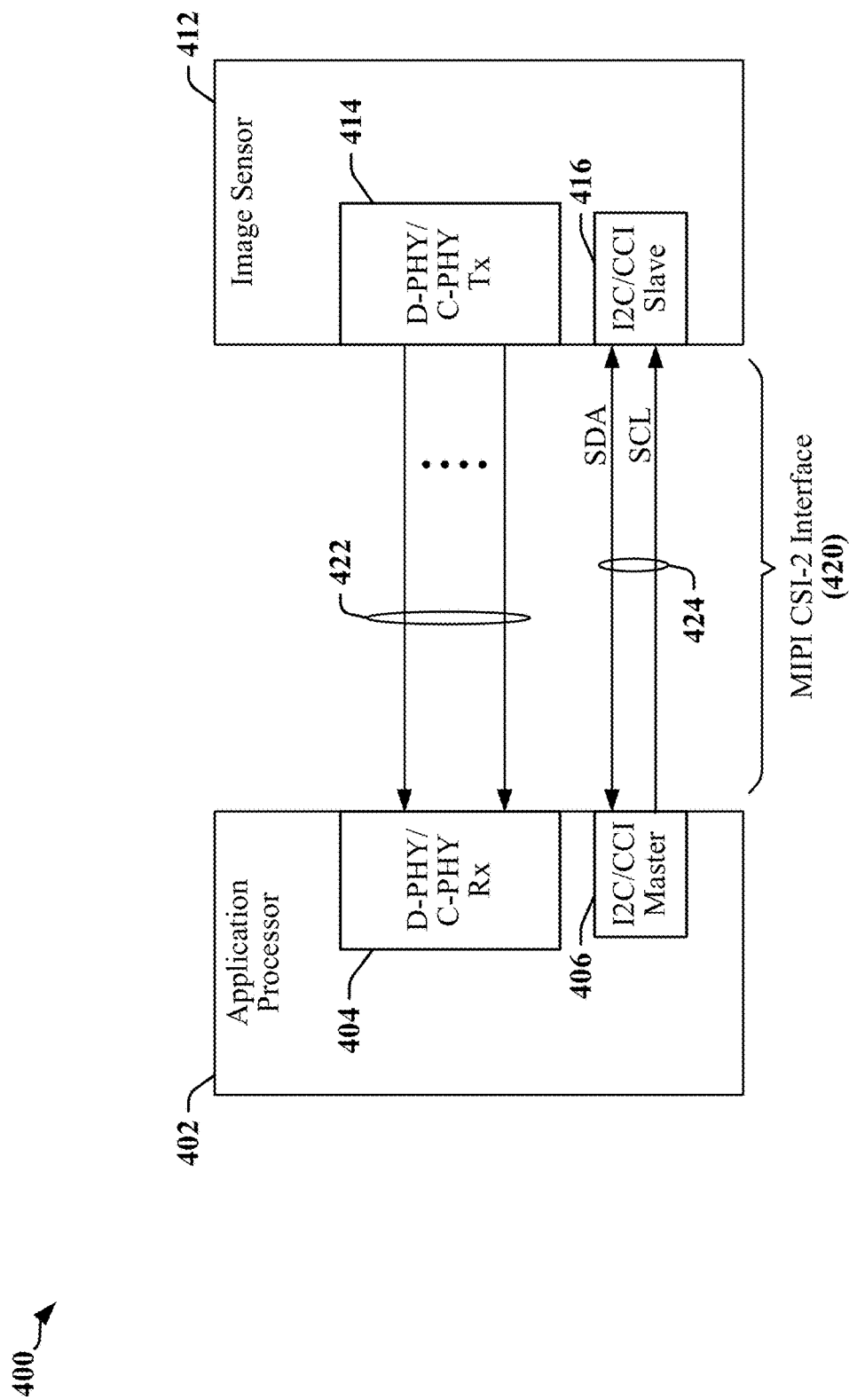
FIG. 4 illustrates a configuration in which a high-speed data bus and a low-speed serial control bus deployed between a system-on-chip (SoC) and a camera in a manner that may be adapted in accordance with certain aspects disclosed herein.

FIG. 4 illustrates an example of a system 400 that includes communication links used to couple an application processor 402 with an image sensor 412, camera or other imaging device. In one example, the system may be embodied in an SoC. In one example, the system may be configured as a MIPI Camera Serial Interface 2 (CSI-2) 420. The image sensor 412 may produce large volumes of pixel data and other data representative of an image captured by the image sensor. Data may be transmitted by the image sensor 412 in bursts when the image sensor 412 is capturing individual images or frames, and/or in continuous flow when the image sensor 412 is operated in a video mode or a multi-image mode. In certain implementations, a unidirectional high-speed image data link 422 is provided to communicate image data from the image sensor 412 to the application processor 402. The application processor 402 may include bus interface circuits (D-PHY or C-PHY Rx 404) that is configured to receive data from the image data link 422. Bus interface circuits (D-PHY or C-PHY Tx 414) in the image sensor 412 may enable the image sensor 412 to communicate over the image data link 422.

A low-speed bidirectional control data bus 424 may be provided to support communication of command and control information between the application processor 402 and the image sensor 412. A control data bus interface 406 in the application processor 402 may transmit commands and receive responses to the commands that amount to a fraction of the image data transmitted when the image sensor 412 is active. The control data bus interface 406 may exchange other types of information with the image sensor 412. A control data bus interface 416 in the image sensor 412 may receive commands and transmit responses to the commands and may exchange other types of information with the application processor 402.

The image sensor 412 may include a controller that may be configured by the application processor 402. The controller may control certain aspects of the operation of the image sensor 412. The control data bus 424 may couple other peripheral devices to the application processor 402 and/or the controller of the image sensor 412. Protocols and specifications governing the high-speed image data link 422 and the control data bus 424 may be defined by the MIPI Alliance, by another standards body, or by a system designer. For the purposes of this disclosure, an architecture based on the CSI-2 standards defined by the MIPI Alliance will be used as an example.

Figure 5:
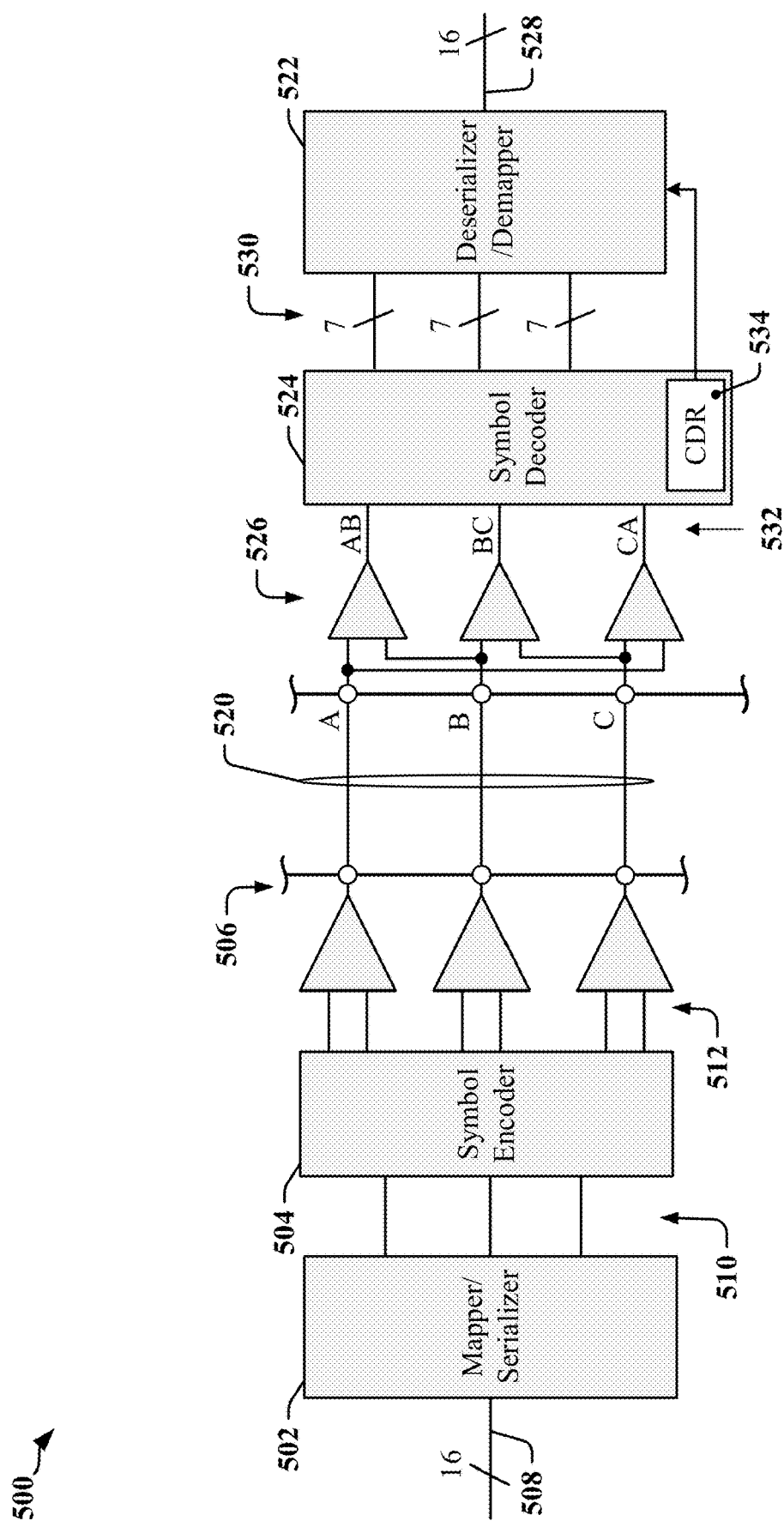
FIG. 5 illustrates a C-PHY interface used to implement a high-speed data bus in accordance with certain aspects disclosed herein.

FIG. 5 illustrates a C-PHY interface 500 that may be operated in accordance with specifications or protocols defined by the MIPI Alliance. The C-PHY physical layer interface technology uses 3-phase polarity encoding. The illustrated C-PHY interface 500 is implemented using a three-wire link 520. At the transmitter, physical layer drivers 506 may each drive a wire of the three-wire link 520. Data is encoded in a sequence of symbols transmitted on the three-wire link 520, where each symbol defines signaling state of the three-wire link 520 for one symbol interval. In each symbol interval, one wire of the three-wire link 520 is undriven and the other two wires of the three-wire link 520 are driven with opposite polarity. C-PHY interface 500 can provide for high-speed data transfer and may consume half or less of the power of other interfaces because fewer than 3 drivers are active in each symbol interval.

In the illustrated C-PHY interface 500, each wire of the 3-wire link 520 may be undriven, driven positive, or driven negative. An undriven signal wire may be in a high-impedance state. An undriven signal wire may be driven or pulled to a voltage level that lies substantially halfway between the positive and negative voltage levels provided on driven signal wires. An undriven signal wire may have no current flowing through it. The signaling states may be denoted as $\{+1, -1, 0\}$, and the line drivers 506 may be adapted to provide each of the three signaling states. In one example, drivers 506 may include unit-level current-mode drivers. In another example, drivers 506 may drive opposite polarity voltages on two signals transmitted on two wires of the three-wire link 520 while the third wire is at high impedance and/or pulled to ground. For each symbol interval, at least one signal is in the undriven (0) state, while the number of signals driven positive (+1 state) is equal to the number of signals driven negative (−1 state), such that the sum of current flowing to the receiver is zero. For each symbol, the state of at least one signal wire is changed from the symbol transmitted in the preceding transmission interval.

The C-PHY interface 500 can encode multiple bits per transition on the three-wire link 520. In one example, a mapper/serializer 502 may map 16-bit data 508 to a set of seven 3-bit symbols which are provided in a serialized 3-bit sequence of raw symbols 510 to a symbol encoder 504. The symbol encoder 504 provides a sequence of control signals 512 corresponding to transmitted symbols that determine the signaling state of the three-wire link 520 for each of seven symbol intervals. The symbol encoder selects each transmitted symbol based on the immediately preceding transmitted symbol and a current raw symbol 510. The symbol encoder 504 operates such that, for each symbol interval, the signaling state of at least one wire (the A, B, C wires) of the three-wire link 520 changes with respect to the signaling state in the immediately preceding symbol interval.

The use of 3-wire, 3-phase encoding permits a number of bits to be encoded in a plurality of symbols where the bits per symbol is not an integer. In the example of a three-wire, three-phase system, there are 3 available combinations of 2 wires, which may be driven simultaneously, and 2 possible combinations of polarity on any pair of wires that is driven simultaneously, yielding 6 possible states. Since each transition occurs from a current state to a different state, 5 of the 6 states are available at every transition such that the signaling state of at least one wire changes at each transition. With 5 states, $\log_2(5) = 2.32$ bits may be encoded per symbol. Accordingly, a mapper may accept a 16-bit word and convert it to 7 symbols, because 7 symbols carrying 2.32 bits per symbol can encode 16.24 bits. In other words, a combination of seven symbols that encodes five states has $5^7$ (78,125) permutations. Accordingly, the 7 symbols may be used to encode the $2^{16}$ (65,536) permutations of 16 bits.

At the receiver, a set of comparators 526 and symbol decoders 524 are configured to provide a digital representation of the state of each wire of the three-wire link 520. Each of the comparators 526 compares signaling state of two wires of the three-wire link 520 to produce a set of difference signals 532, including AB, BC and CA difference signals. The symbol decoder 524 may include a clock and data recovery (CDR) circuit 534 that generates a clock signal using transitions detected in the state of the three-wire link 520 between successive symbol intervals, where the clock signal is used to capture symbol values that represent signaling state of the three-wire link 520. A deserializer/demapper 522 receives a set of 7 symbols 530, which is demapped to obtain 16 bits of output data 528.

Figure 6:
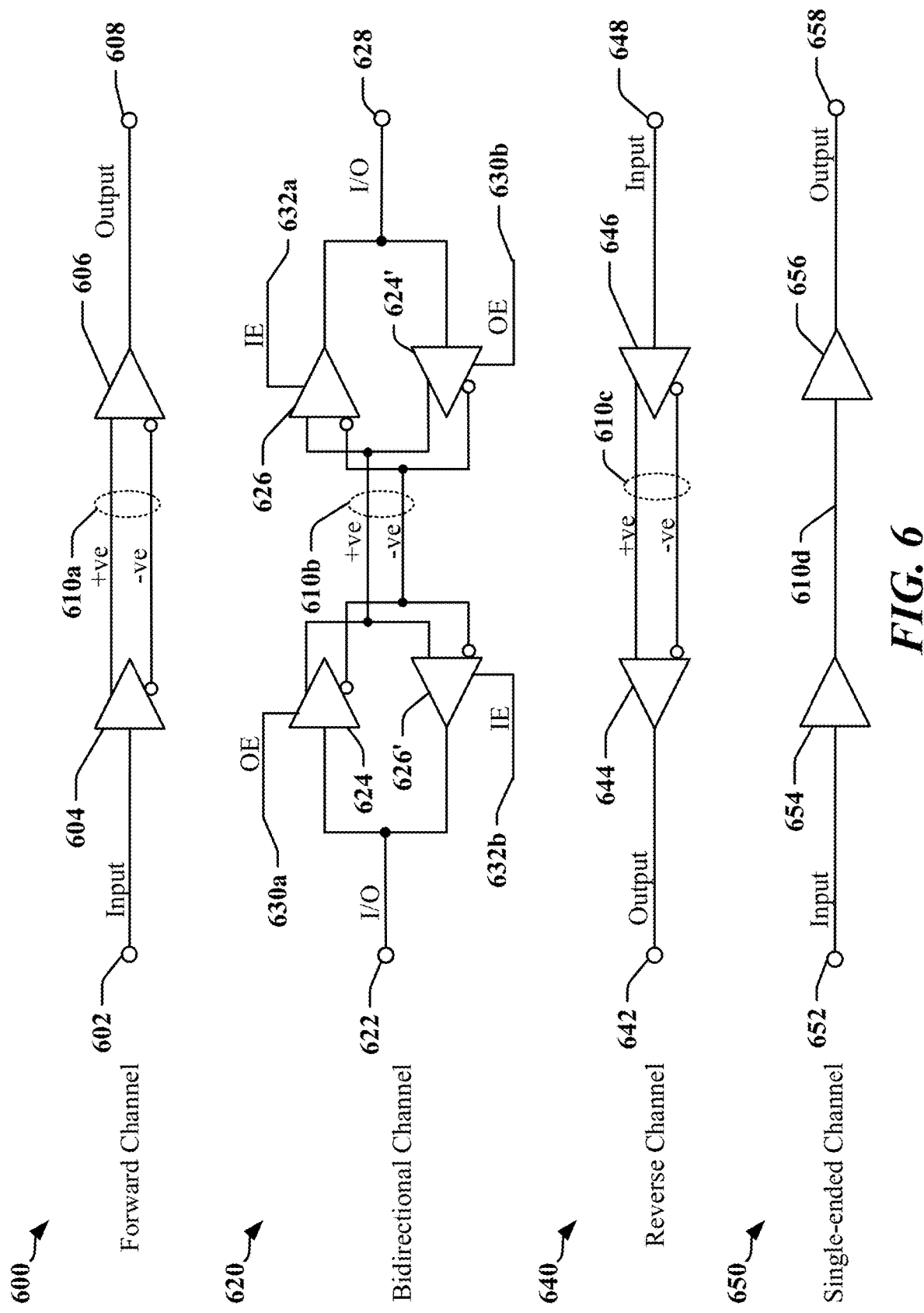
FIG. 6 illustrates certain aspects of a configuration of drivers and receivers in a serial interface.

FIG. 6 illustrates different configurations of drivers, receivers and/or transceivers that may be used to drive a serial bus and to receive signals from the serial bus. Certain of the configurations may be used to support general purpose serial communications, or may be operated in accordance with an I3C, D-PHY, M-PHY, C-PHY, RFFE, SPMI or other protocol.

Differential signaling typically involves transmitting information electrically using two complementary signals sent on a pair of wires 610a, 610b or 610c, which may be referred to as a differential pair. The use of differential pairs can significantly reduce electromagnetic interference (EMI) by canceling the effect of common-mode interference that affects both wires in a differential pair. On the forward channel 600, a pair of wires 610a may be driven by a host differential driver 604. The differential driver 604 receives a stream of input data 602 and generates positive and negative versions of the input data 602, which are then provided to the pair of wires 610a. The differential receiver 606 on the client side generates an output data stream 608 by performing a comparison of the signals carried on the pair of wires 610a.

On the reverse channel 640, one or more pairs of wires 610c may be driven by a client-side differential driver 646. The differential driver 646 receives a stream of input data 648 and generates positive and negative versions of the input data 648, which are provided to the pair of wires 610c. The differential receiver 644 on the host generates an output data stream 642 by performing a comparison of the signals carried on the pair of wires 610c.

In a bidirectional channel 620, the host and client may be configured for half-duplex mode and may transmit and receive data on the same pair of wires 610b. A bidirectional bus may alternatively or additionally be operated in full-duplex mode using combinations of the forward and reverse differential drivers 604, 646 to drive multiple pairs of wires 610a, 610c. In the half-duplex bidirectional implementation depicted for the bidirectional channel 620, the differential drivers 624 and 624' may be prevented from driving the pair of wires 610b simultaneously using, for example, a respective output enable (OE) control 630a, 630b to force the differential drivers 624 and 624' into a high impedance state. The differential receiver 626' may be prevented from driving the input/output 622 while the differential driver 624 is active, typically using an OE control 630b to force the differential receiver 626' into a high impedance state. The differential receiver 626 may be prevented from driving the input/output 628 while the differential driver 624' is active, typically using an input enable (IE) control 632b to force the differential receiver 626 into a high impedance state. In some instances, the outputs of the differential drivers 624 and 624' and the differential receivers 626 and 626' may be in a high-impedance state when the interface is not active. Accordingly, the OE controls 630a, 630b of the differential drivers 624, 624' and the IE controls 632a, 632b of the differential receivers 626, 626' may be operated independently of one another.

Each of the differential drivers 604, 624, 624' and 646 may include a pair of amplifiers, one receiving at one input the inverse of the input of the other amplifier. The differential drivers 604, 624, 624' and 646 may each receive a single input and may have an internal inverter that generates an inverse input for use with a pair of amplifiers. The differential drivers 604, 624, 624' and 646 may also be constructed using two separately controlled amplifiers, such that their respective outputs can be placed in high impedance mode independently of one another.

In one example, the differential drivers 604, 624, and/or 646 may be reconfigured or controlled such that only one of the wires in a pair of wires 610a, 610b or 610c of an active lane is driven. In other examples, the differential drivers 604, 624, and/or 646 may be turned off or placed in a high-impedance output mode. In other examples, a single-ended channel 650 may employ separate, single-ended line drivers 654 and receivers 656 to provide communications over a single-wire, single-ended link 610d. The single-ended line drivers 654 and receivers 656 may be used in a C-PHY interface for example. In some instances, the input 652 and output 658 of the single-ended link 610d may be bidirectional, and both transmitting and receiving devices may employ a transceiver that includes both a line driver 654 and a receiver 656 that is controlled in accordance with one or more protocols.

Certain aspects of this disclosure relate to a SERDES physical layer circuits (SERDES PHY) that are configured for high-frequency transmissions. The SERDES PHY may be used to implement communication links within or between integrated circuits, semiconductor die and/or device packages. Improved reliability can be obtained for a SERDES PHY that has been adapted to include impedance matching techniques provided in accordance with certain aspects of this disclosure.

Figure 7:
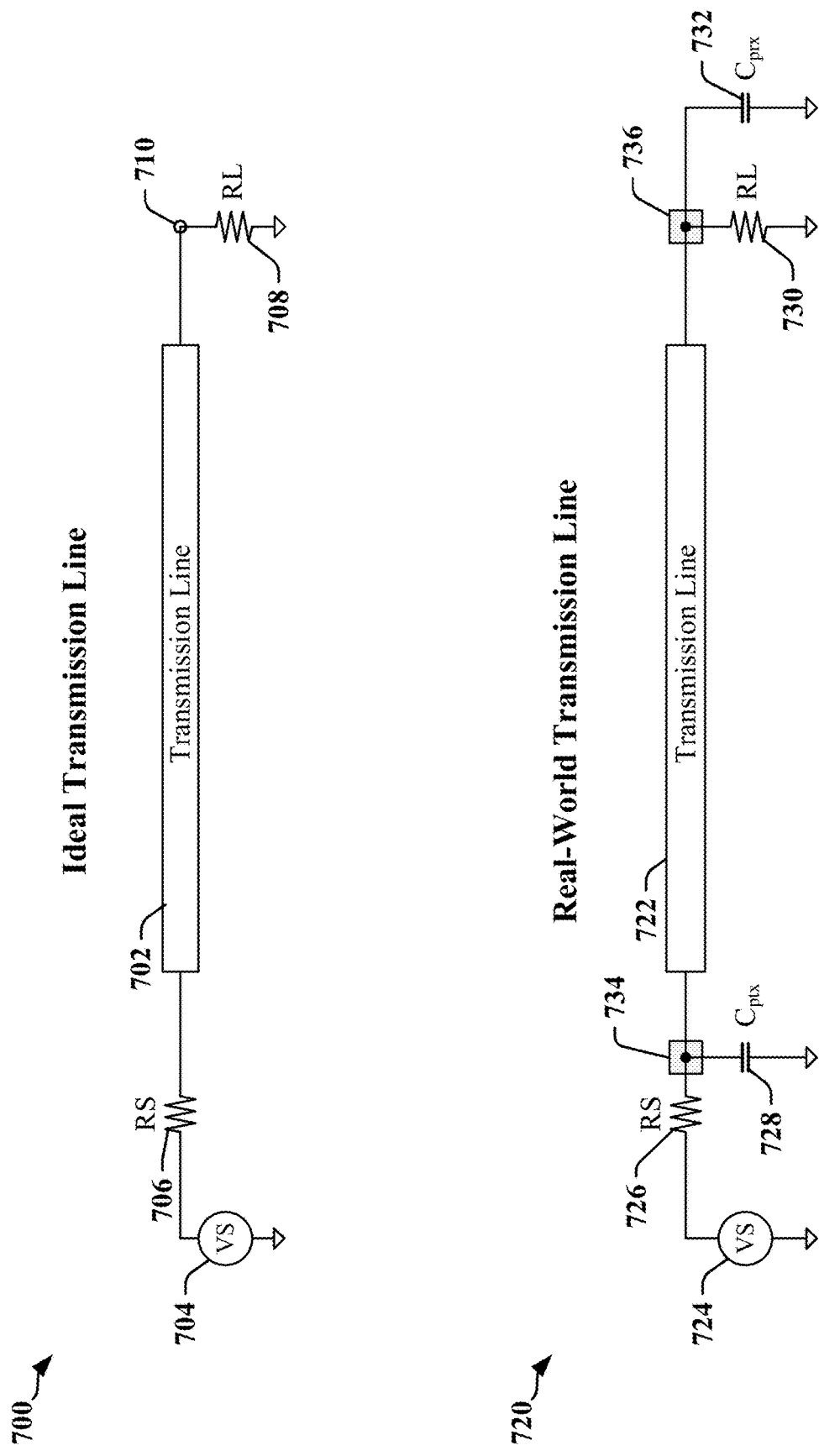
FIG. 7 illustrates a communication link that may be implemented using a physical layer that includes a source and a load.

FIG. 7 illustrates a communication link 700 that may be implemented using a SERDES physical layer. In a conceptual communication link 700, a voltage source 704 drives an ideal transmission line 702 that has a characteristic impedance ($Z_0$), which may be defined as the ratio of the amplitudes of voltage and current of a signal propagating along the transmission line 702. In the illustrated example, the transmission line 702 is terminated by terminating resistors 706, 708 that match the characteristic impedance of the transmission line 702.

A resistor may be defined as a two-terminal electrical component that has a configured or configurable electrical resistance and/or that dissipates electrical power. Other components may present a resistance to electrical current and may dissipate power. For example, the transmission line 702 may have a relatively low resistance that is proportional to the physical length, cross-sectional area, temperature and/or other characteristics or factors. In certain aspects of this disclosure, resistors may have a resistance of at least 5 ohms. In various examples provided in this disclosure, terminating resistors or resistors used in terminating circuits have 25 ohm, and 50 ohm resistors. Resistors of other values of resistance can be used in different implementations.

Resistors may be provided as discrete components, deposited structures and/or structures fabricated in an IC device.

A first terminating resistor 706 couples the voltage source 704 to a first end of the transmission line 702, and a second terminating resistor 708 is coupled between a second end of the transmission line 702 and circuit ground. The terminating resistors 706, 708 have a value that is selected to match the characteristic impedance of the transmission line 702. When the terminating resistors 706, 708 match the characteristic impedance of the transmission line 702, signal reflections are suppressed. A signal reflection may occur when a signal received from the transmission line 702 is not totally absorbed at the receiving end and unabsorbed energy bounces back along the transmission line 702. For example, a major proportion of the energy in a signal arriving at an unterminated transmission line may be reflected when a line receiver in the receiving device presents a high impedance input to the unterminated transmission line. The voltage reflection coefficient of the transmission line 702 may be defined as the ratio of the voltage of the reflected signal at the terminating point 710 of the transmission line 702 to the voltage of the arriving signal (or incident signal) at the terminating point 710. The voltage reflection coefficient may be expressed as:

$$\Gamma = \frac{(Z_L - Z_0)}{(Z_L + Z_0)},$$

where $Z_L$ is the impedance of the load at the terminating point 710 (here a resistor $R_L$), and where $Z_0$ is the characteristic impedance of the transmission line 702. In some instances, the characteristic impedance and the terminating resistors 706, 708 have resistance value of 50Ω (50 ohms).

FIG. 7 also illustrates a model of a real-world communication link 720 where parasitic pad capacitances 728, 732 are present at termination nodes, which are represented as input/output (I/O) pads 734, 736 respectively. In the illustrated real-world communication link 720, a voltage source 724 drives a transmission line 722 that has a nominal characteristic impedance ($Z_0$). The transmission line 722 is terminated by terminating resistors 726, 730 that are selected to match the characteristic impedance of the transmission line 722. A first terminating resistor 726 couples the voltage source 724 to a first end of the transmission line 722, and a second terminating resistor 730 is coupled between a second end of the transmission line 722 and circuit ground. Reflections can occur when the terminating resistors 726, 730 do not closely match the characteristic impedance of the transmission line 722.

The parasitic pad capacitances 728, 732 alter the termination impedances by adding reactance. Altered terminations can cause an impedance mismatch with respect to the characteristic impedance of the transmission line 722. Consequently, signal reflections can be expected at both ends of the transmission line 722. In some instances, parasitic capacitance present at the input of a receiving device may be observed at the I/O pad 736.

Mobile communication devices and other devices are used in applications that demand greater data throughput from serial interfaces. Demands for increased data throughput have been addressed in many applications by increasing the frequency of operation of the serial interfaces. In some instances, serial interfaces are operated at frequencies of 5 GHz and more. The reactance introduced by parasitic pad capacitance at the termination points of a transmission line is inversely proportional to the frequency of signals transmitted over the transmission line and the operation of a serial bus at higher frequency produces lower reactance. Furthermore, the wavelength of higher frequency signals transmitted over a copper transmission line may be comparable to the physical length of the transmission line in a mobile communication device, which can exacerbate interference caused by reflections when reflected edges in a digital signal arrive coincide with the arrival of a subsequent edge in the digital signal.

Figure 8:
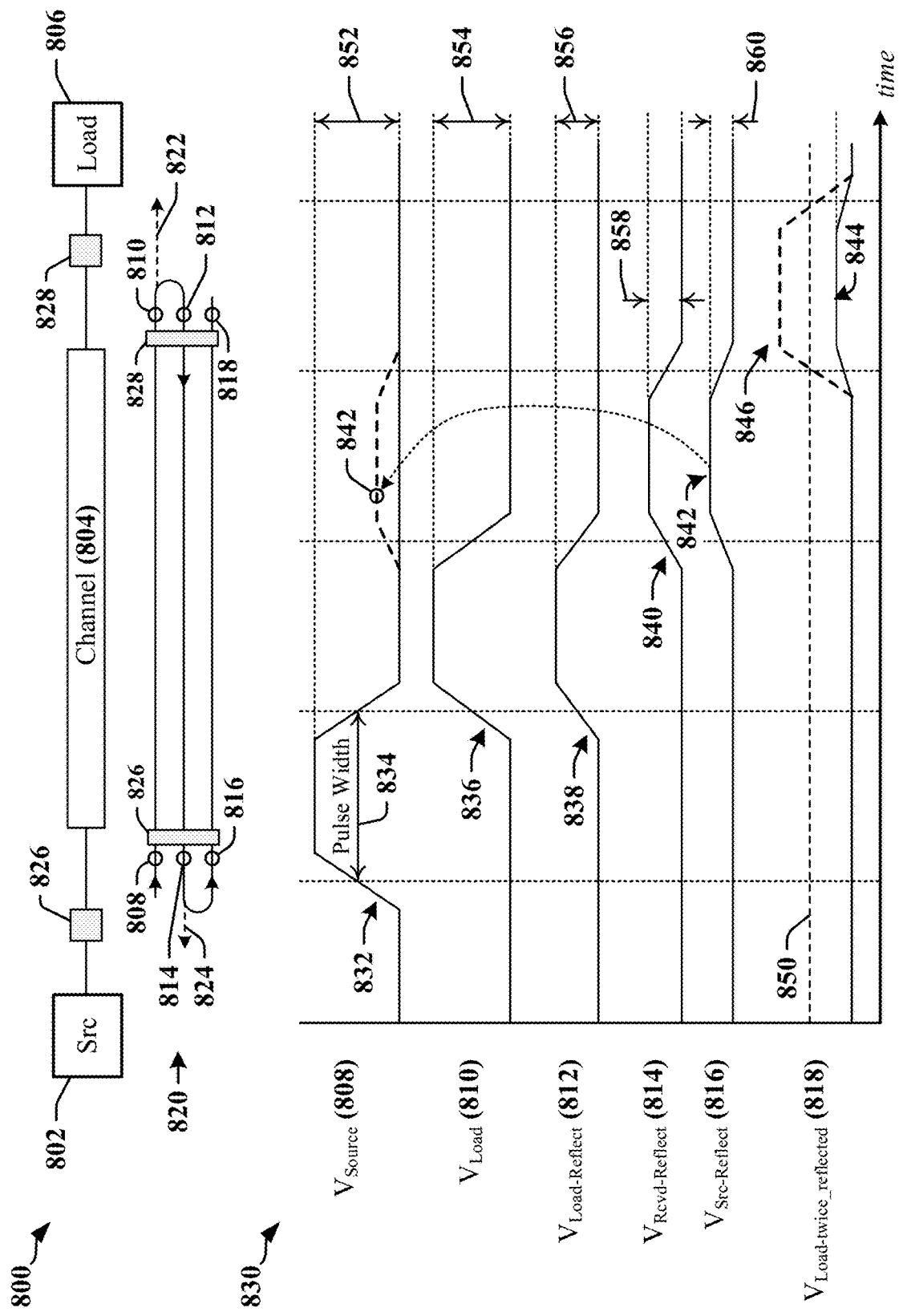
FIG. 8 illustrates the effect of impedance mismatch on signaling in a channel of a serial communication link.

FIG. 8 illustrates the effect of impedance mismatch on signaling 830 in a channel 804 of a communication link 800 that employs a SERDES PHY. The communication link 800 includes a source device 802 and load device 806 coupled by a transmission line that provides the channel 804. An impedance mismatch is present at each end of the channel. The impedance mismatch at the source device 802 may be attributable to parasitic capacitance and/or other capacitances present at the transmitting pad 826. The impedance mismatch at the load device 806 may be attributable to parasitic capacitance and/or other capacitances present at the receiving pad 828.

A pulse 832 is launched into the channel 804 in a signal originating at a transmitter in the source device 802. The fundamental frequency of the pulse may correspond to a wavelength in the channel 804 that is of the same order of magnitude as the physical length of the channel 804. In one example, the pulse 832 may correspond to a half-cycle of a 5 GHz clock signal and the pulse 832 may be transmitted over a wire, connector or other transmission line that is approximately 4 cm long. In the illustrated example, the transmission time of a pulse over the channel 804 closely matches the pulse width 834.

The launch of the pulse 832 introduces energy into the channel. In an ideal, lossless, impedance-matched channel, all of the energy introduced into the channel 804 at the source device 802 is absorbed at the load device 806. In real-world implementations, some energy is lost in transmission through the channel 804 and parasitic capacitance can cause interfering reflections. When the channel 804 is long enough, the transmission loss may be sufficiently large that the reflected waveforms are attenuated to the extent that reflected energy has little effect on the receiver in the load device 806. In mobile communication devices, serial bus transmission lines have a length in the order of 4 cm and reflections can have a deleterious effect on the receiver.

As illustrated generally in the flow diagram 820, the pulse 832 produces a voltage 808 at the transmitting pad 826 that has a launch amplitude 852 when the pulse 832 is launched into the channel 804. The pulse 832 traverses the channel 804 and produces a voltage 810 with an attenuated amplitude 854 when the arriving pulse 836 reaches the receiving pad 828 at the receiver. The receiver sees an arriving pulse 836 that has been attenuated due to the effect of losses in the channel 804. The receiver absorbs most of the energy 822 in the arriving pulse 836. Some energy is retained in the channel 804 in a reflected pulse 838 that bounces from the receiving pad 828 and returns toward the transmitter. The voltage 812 at the receiving pad 828 that is attributable to the reflected pulse 838 has an initial amplitude 856.

The reflected pulse 838 traverses the channel 804 and arrives as an attenuated reflected pulse 840 that produces a voltage 814 with a further attenuated amplitude 858 when the attenuated reflected pulse 840 reaches the transmitting pad 826. The transmitter absorbs most of the energy 824 in the attenuated reflected pulse 840. Some energy is retained in the channel 804 in a twice-reflected pulse 842 that bounces from the transmitting pad 826 and returns toward the receiver. The voltage 816 at the transmitting pad 826 that is attributable to the twice-reflected pulse 842 has an initial amplitude 860. The twice-reflected pulse 842 is added to the signal that originates at the transmitter in the source device 802.

The twice-reflected pulse 842 traverses the channel 804 and contributes a voltage 818 that is added to the voltage produced by the transmitter-originated signal. In the illustrated example, the twice-reflected pulse 842 combines with the low-voltage state of the transmitter-originated signal. The receiver sees an attenuated twice-reflected pulse 844. When the attenuated twice-reflected pulse 844 interferes with a second pulse transmitted by the receiver, the receiver sees an arriving second pulse 846 with an increased amplitude.

The attenuated twice-reflected pulse 844 can cause errors in data reception. The attenuated twice-reflected pulse 844 may have an effect on one or more edges of the arriving second pulse 846 at the receiver. The presence of the attenuated twice-reflected pulse 844 at the receiver may be interpreted as a valid pulse when the amplitude of the attenuated twice-reflected pulse 844 exceeds a threshold level 850 used to distinguish between logic levels. In another example, the addition of the attenuated twice-reflected pulse 844 to the arriving second pulse 846 may alter the time at which the voltage level at the receiver crosses the threshold level 850 used to distinguish between logic levels. Differences in timing of threshold crossings causes jitter in the received signals. Jitter can affect a clock signal and/or may require increased timing tolerances that allow the receiver to ignore reflected signals. Jitter can limit the maximum frequency of signals transmitted through the channel 804. Jitter can be particularly troublesome when pulses have durations that are close in length to the transition time of edges through the channel 804.

Attenuation and loss during transmission through a physically short channel may be lower than attenuation through a physically long channel. High-frequency signals transmitted through a short channel 804 may be affected by multiple reflections when attenuation in the channel is low. Multiply-reflected waveforms can significantly interfere with incoming signals.

Figure 9:
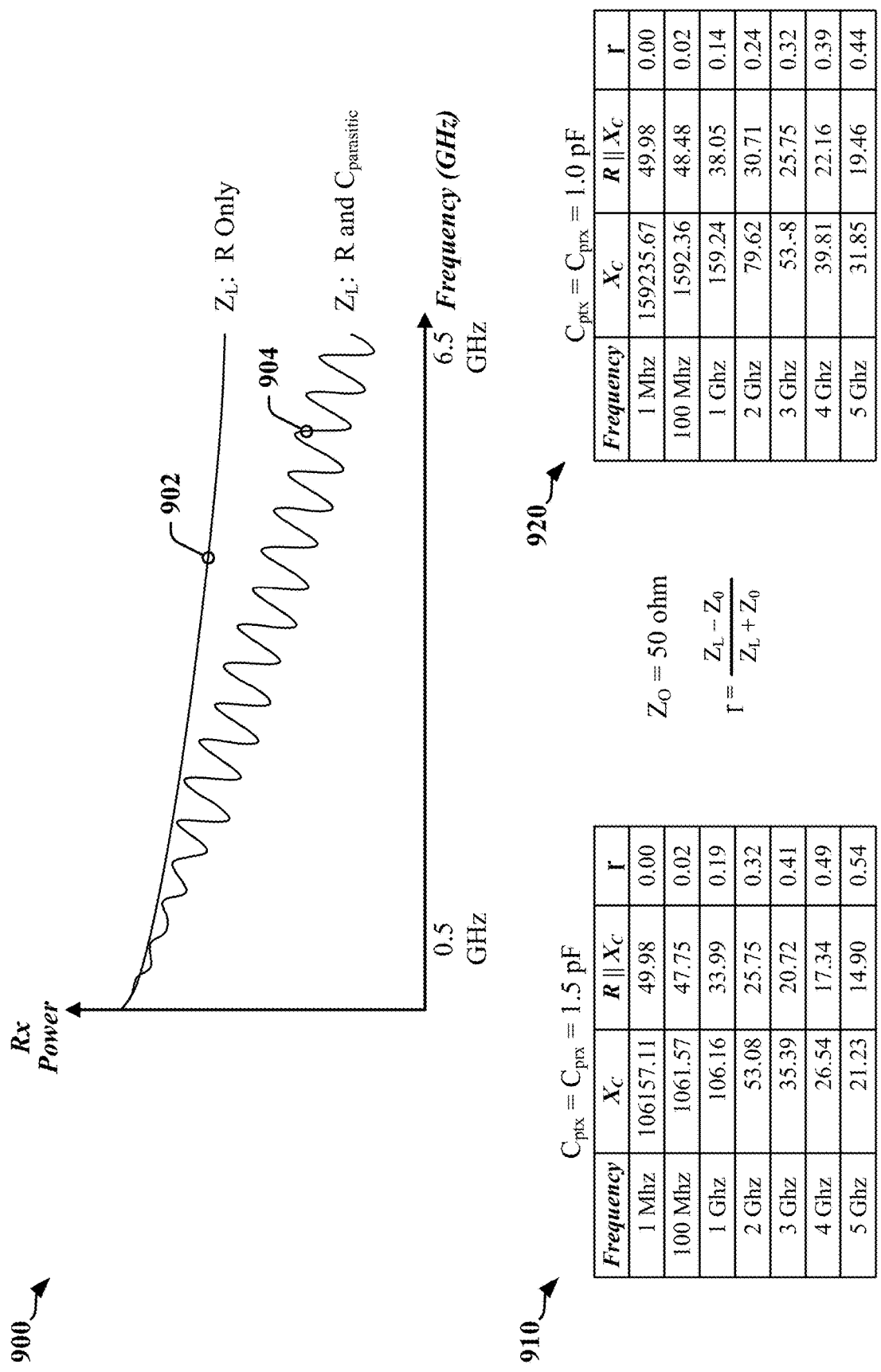
FIG. 9 illustrates the effect of multiple reflections on a signal transmitted through a lossy channel that has mismatched terminations.

FIG. 9 includes a graph 900 that illustrates the effect of multiple reflections on a signal transmitted through a lossy channel that has mis-matched terminations. A first curve 902 illustrates insertion loss (primarily channel attenuation) for the channel over a range of frequencies. The first curve 902 relates to a channel that is terminated with matching impedances. A second curve 904 relates to a channel that has mismatched terminations. The second curve 904 illustrates insertion loss and reflection loss, where reflection loss corresponds to power that was reflected rather than being received and absorbed at the receiver. The second curve 904 illustrates the effect of resonance, which may be caused by standing waves that occur when transitions in the signal occur just as reflections of previously transmitted transitions arrive at the transmitter and/or receiver.

The resonating insertion loss illustrated in the second curve 904 can result in configurations where loss at a higher frequency can be less than loss at a lower frequency. Such insertion loss behavior can be referred to as non-monotonic and/or non-linear with respect to the frequency. The resonating insertion loss illustrated in the second curve 904 may indicate that conventional methods of combatting reflections may not be effective when the frequency of transmitted signals results in pulse durations that are multiples of the transition time through the channel.

FIG. 9 includes tables 910, 920 that illustrate the effect of signaling frequency on terminating impedance and the voltage reflection coefficient ($\Gamma$) when parasitic capacitance is present at the terminations of a channel that has a 50 ohm characteristic impedance. Capacitive reactance may be calculated as $1/(\omega \times C)$, where $\omega$ is the angular frequency of the signal received at the termination. The first table 910 relates to an interface in which the parasitic capacitance has a value of 1.5 pF and the second table 920 relates to an interface in which the parasitic capacitance has a value of 1.0 pF. Each table includes reactance ($X_C$), resultant termination impedance ($R \| X_C$) and reflection coefficient, which may be used to calculate power loss due to reflections.

Continuous Time Linear Equalizer (CTLE) is used in certain interfaces to combat channel losses caused by parasitic capacitance. CTLE provides a simple, low-cost equalization solution that is effective when channel loss has a linear relationship with frequency. However, CTLE can be ineffective in the presence of non-linear interference, including when the resonating channel loss is not linear. For example, CTLE may provide over-equalization and/or under-equalization at different frequencies.

Figure 10:
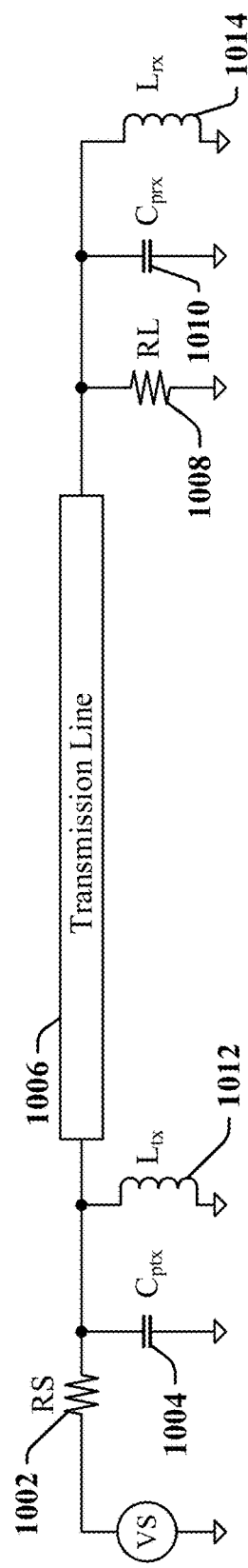
FIG. 10 illustrates an example of inductive termination in a high-frequency serial interface.

FIG. 10 illustrates an example of inductive termination 1000 in which two inductors 1012, 1014 are added to the termination circuits in a high-frequency interface. Each end of the transmission line 1006 includes a transmission circuit that has a resistor 1002 or 1008, parasitic capacitance 1004 or 1010 and inductor 1012 or 1014. The inductors 1012, 1014 have an inductance value selected to cancel the effect of the corresponding parasitic capacitance 1004 or 1010. Inductive reactance may be calculated as $\omega \times L$, where $\omega$ is the angular frequency of the signal received at the termination. Inductive reactance increases as capacitive reactance decreases, and inductive termination circuits are tuned to a design frequency. Inductive termination circuits may perform sub-optimally when signaling frequency varies.

Figure 11:
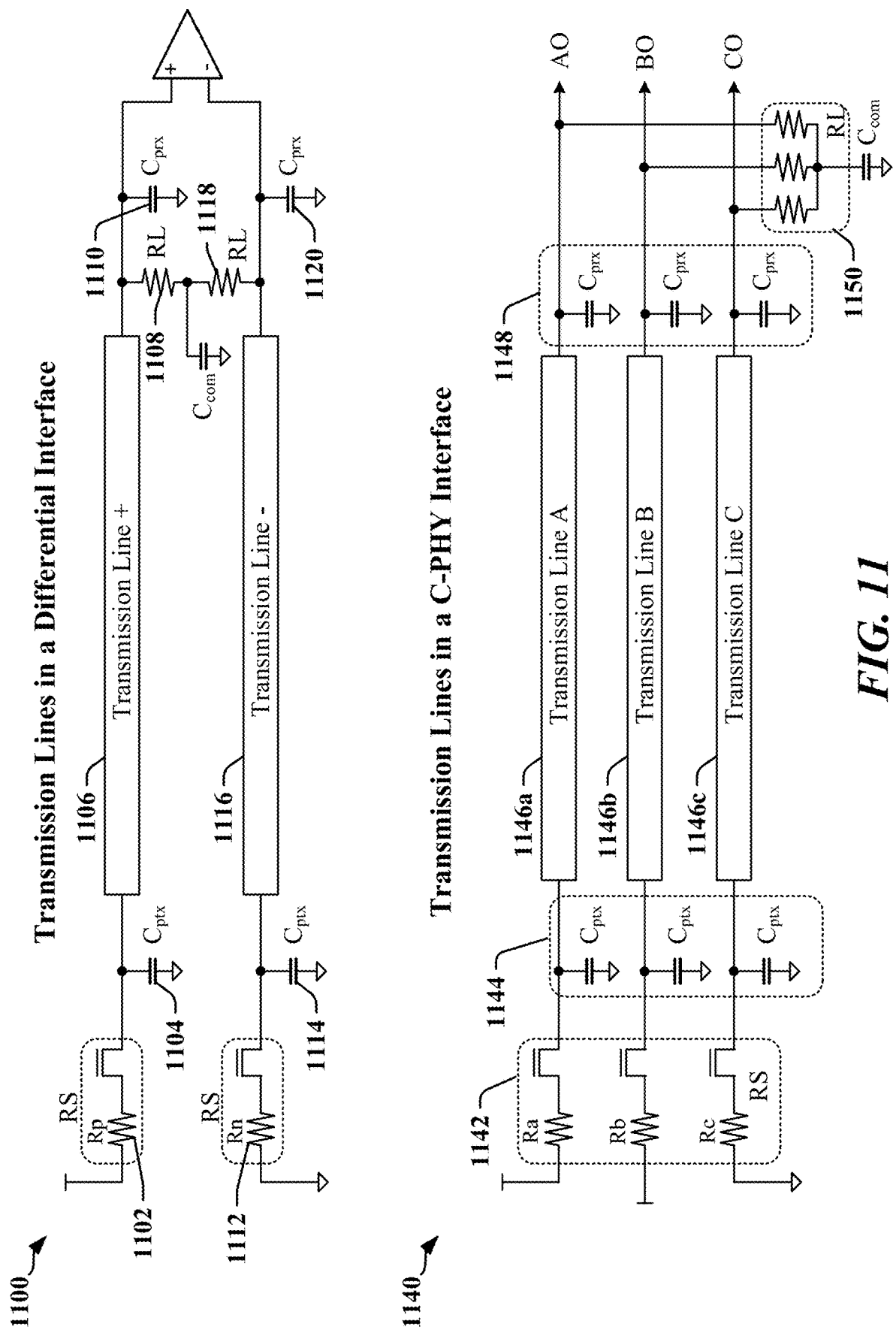
FIG. 11 illustrates two-wire and three-wire differential links that may be adapted in accordance with certain aspects disclosed herein.

The characteristics of an impedance-mismatched transmission line in the communication link may also be attributed to individual transmission lines in differential communication links. FIG. 11 illustrates a two-wire differential link 1100 in which a signal is transmitted in opposite-polarity versions on two physically-close wires. Each wire may be characterized as a transmission line 1106, 1116. The resistors 1102, 1112 in the transmitter and the resistors 1108, 1118 in the receiver that are used to terminate respective transmission lines 1106, 1116 have resistance values that match the nominal characteristic impedances of the transmission lines 1106, 1116. Parasitic capacitances 1104, 1114, 1110, 1120 in the transmitter and receiver are coupled to respective transmission lines 1106, 1116.

FIG. 11 also illustrates a three-wire differential link 1140, which may be used in a C-PHY interface, for example. In a C-PHY interface, a three-phase signal is transmitted in different phases on each of three wires. Each wire may be characterized as a transmission line 1146a, 1146b 1146c. A set of switched resistors 1142 in the transmitter and a set of resistors 1150 in the receiver are used to terminate respective transmission lines 1146a, 1146b 1146c and have resistance values that match the nominal characteristic impedances of the transmission lines 1146a, 1146b 1146c. Parasitic capacitances 1144, 1148 affecting the transmitter and receiver are also coupled to the respective transmission lines 1146a, 1146b 1146c.

Certain aspects of this disclosure relate to a termination scheme that can operate at high signaling frequencies and can reduce resonance effects including interference caused by multiply-reflected waveforms. The presently disclosed termination scheme is effective in terminating short channels at the transmitting end and at the receiving end. In some examples, a cost-effective approach to suppressing the effects of parasitic capacitance includes splitting the termination resistance between two resistors. In one example, a first resistor is coupled to the transmission line and to the connection pad of a device and second resistor is provided after the connection pad of the device, including when the parasitic capacitance is sourced in the pad and/or coupled to the pad. The first resistor may be provided external to the IC device that includes the transmitter or receiver. In one example, the first resistor is provided on a chip carrier, printed circuit board or a substrate that carries the IC device that includes the transmitter or receiver. The proposed termination scheme can improve impedance matching and suppress multi-reflection interference in short channels. The proposed termination scheme can linearize the response of the channel to changing signal frequency, and can enable optimal performance of a CTLE.

Figure 12:
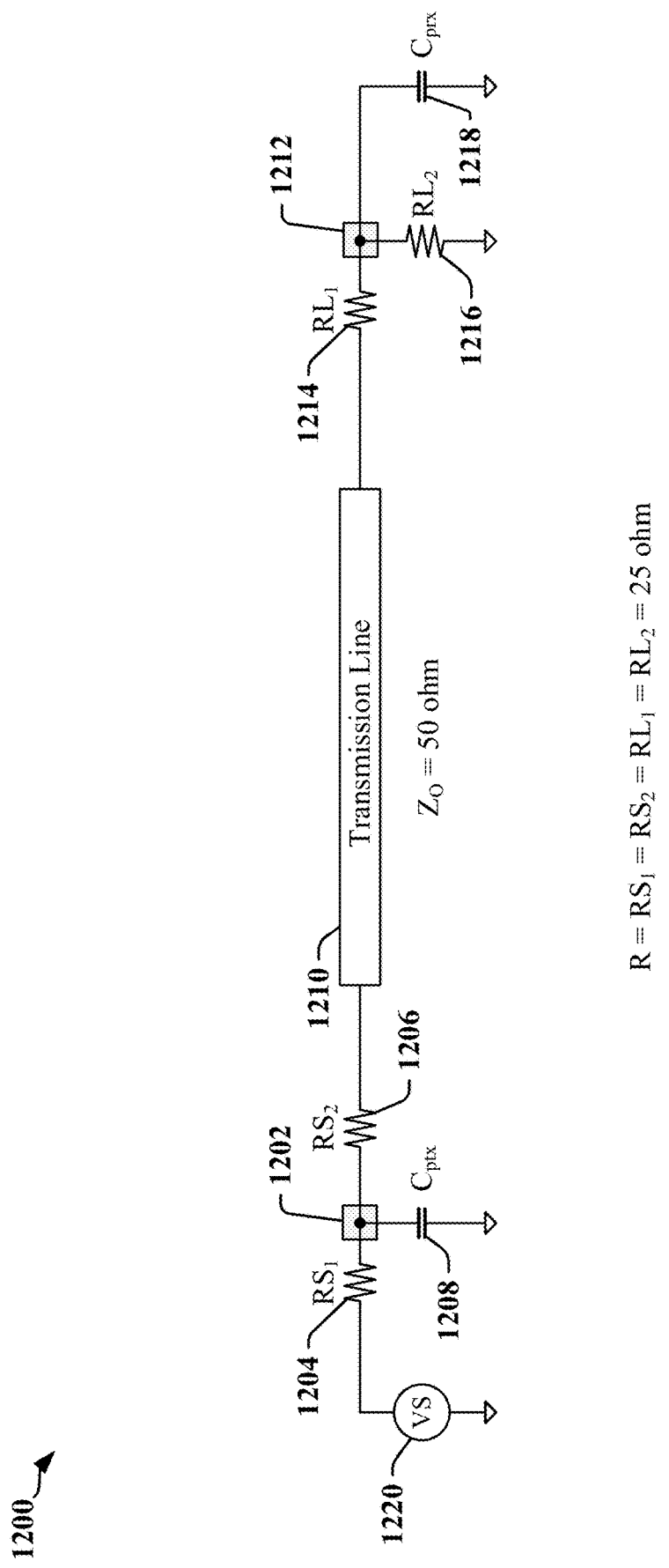
FIG. 12 illustrates an example of communication link that has been adapted in accordance with certain aspects of this disclosure.

FIG. 12 illustrates an example of communication link 1200 that has been adapted in accordance with certain aspects of this disclosure. As illustrated, a voltage source 1220 drives a transmission line 1210 that has a nominal characteristic impedance ($Z_0$). The voltage source 1220 may represent a line driver in a transmitting device. In the illustrated example, the transmission line 1210 is terminated by a pair of terminating resistors 1204, 1206 at the transmitting end and by a pair of terminating resistors 1214, 1216 at the receiving end. At the transmitting end, the terminating resistors 1204, 1206 couple the voltage source to the transmission line 1210, and provide a combined resistance that matches the nominal value of the characteristic impedance of the transmission line 1210. At the receiving end, the terminating resistors 1214, 1216 couple the transmission line 1210 to circuit ground and provide a combined resistance that matches the nominal value of the characteristic impedance of the transmission line 1210.

In a transmitting device, the terminating resistors 1204, 1206 are coupled to one another at or through an I/O pad 1202. In one example, the terminating resistors 1204, 1206 each have a resistance equal to about half the nominal value of the characteristic impedance of the transmission line 1210. One or more parasitic capacitances 1208 are shown as being coupled to the I/O pad 1202 which is located at the connecting point of the pair of terminating resistors 1204, 1206 at the transmitting end of the transmission line 1210. In some examples, a first terminating resistor 1204 is provided on the same IC device that includes the transmitting device. The second terminating resistor 1206 may be provided on the same IC device that includes the transmitting device. In some examples, the second terminating resistor 1206 is provided external to the IC device that includes the transmitting device. For example, the second terminating resistor 1206 can be provided on a chip carrier, printed circuit board or a substrate that carries the IC device that includes the transmitting device.

In a receiving device, the terminating resistors 1214, 1216 are coupled to one another at or through an I/O pad 1212. One or more parasitic capacitances 1218 are shown as being coupled to the I/O pad 1212 and thereby also coupled at the connecting point of the pair of terminating resistors 1214, 1216 at the receiving end of the transmission line 1210. An input of a line receiver circuit may be coupled to the I/O pad 1212 and may present a high-impedance to the I/O pad 1212. The input of the line receiver circuit may contribute to the parasitic capacitance at the I/O pad 1212. In one example, the terminating resistors 1214, 1216 each have a resistance equal to about half the nominal value of the characteristic impedance of the transmission line 1210. In some examples, a first terminating resistor 1214 may be provided within the same IC device that includes the receiving device. In other examples, the first terminating resistor 1214 may be provided external to the IC device that includes the receiving device. For example, the first terminating resistor 1214 may be provided on a chip carrier, printed circuit board or a substrate that carries the IC device that includes the receiving device.

Figure 13:
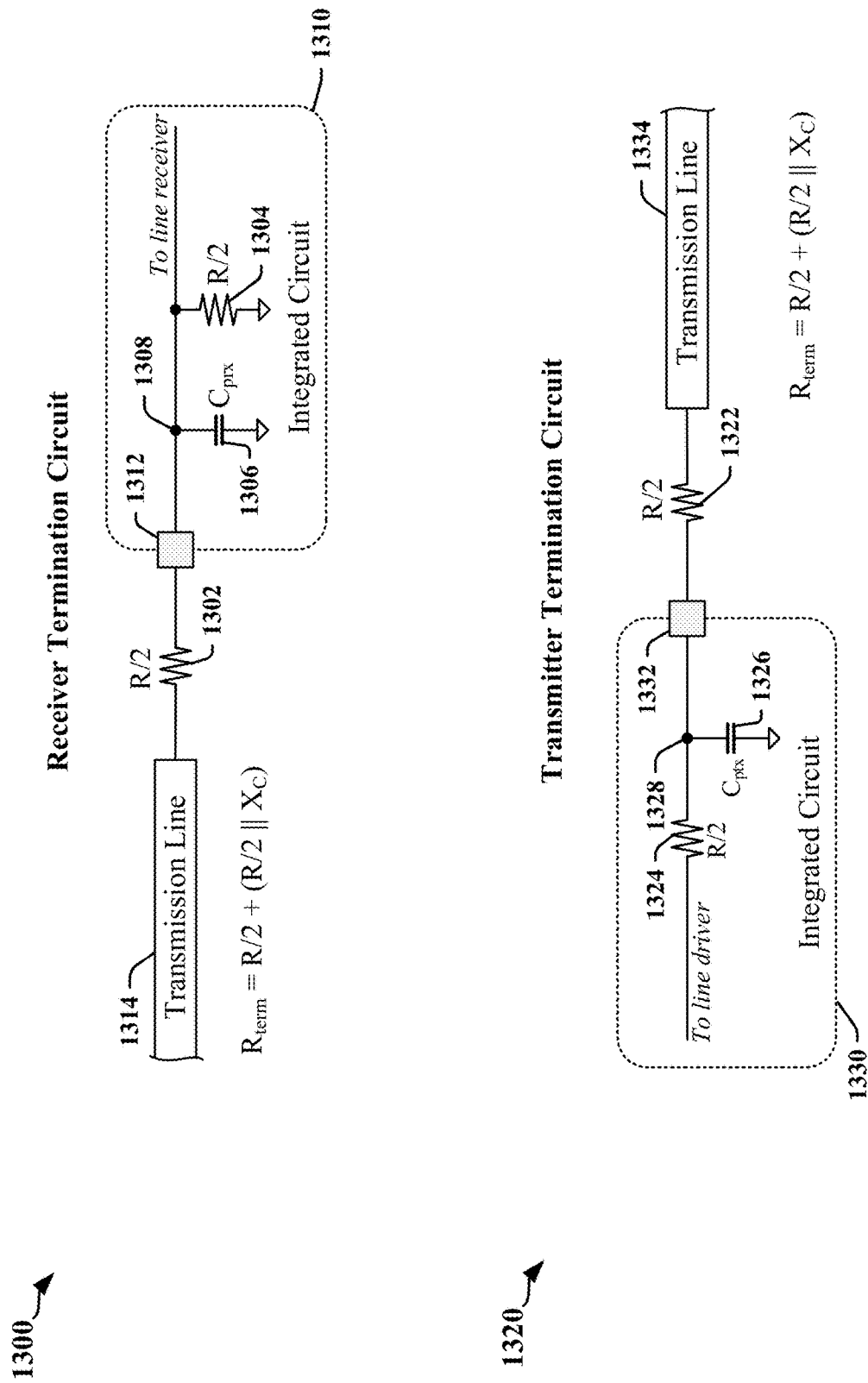
FIG. 13 includes examples of terminating circuits configured in accordance with certain aspects of this disclosure.

FIG. 13 includes an example of a receiver terminating circuit 1300 configured in accordance with certain aspects of this disclosure. An IC device 1310 is coupled to a transmission line 1314 through the receiver terminating circuit 1300. The transmission line 1314 may provide a single ended lane of a serial bus or parallel bus. The receiver terminating circuit 1300 has a first resistor 1302 and a second resistor 1304 coupled at a center point 1308 of the receiver terminating circuit 1300.

In the illustrated example, the first resistor 1302 is physically located outside the IC device 1310 and is configured to couple an I/O pad 1312 of the IC device 1310 to the transmission line 1314. In some examples, the first resistor 1302 is provided on a chip carrier, printed circuit board or a substrate that carries the IC device 1310. The center point 1308 of the receiver terminating circuit 1300 lies within the IC device 1310 and is coupled to the I/O pad 1312 and to the first resistor 1302 through the I/O pad 1312. The center point 1308 may be further coupled to a high-impedance input of a line receiver, comparator or other such device within the IC device 1310. The second resistor 1304 is further coupled to circuit ground.

The first resistor 1302 and the second resistor 1304 are connected in series and the combination terminates the transmission line 1314 to circuit ground through a combined resistance of R. The resistance values of the first resistor 1302 and the second resistor 1304 may be selected to match the nominal value of the characteristic impedance ($Z_0$) of the transmission line 1314. The nominal value of the characteristic impedance of the transmission line 1314 may be defined as the designed impedance of the transmission line 1314, where some variance from the nominal value may be observed in some systems. The characteristic impedance for an ideal transmission line is purely resistive. In some examples, the first resistor 1302 and the second resistor 1304 that have equal resistance values (R/2), where $R=Z_0$.

A parasitic capacitor 1306 is represented as being coupled to the center point 1308 of the series-connected first resistor 1302 and second resistor 1304. The parasitic capacitor 1306 may account for a parasitic capacitance associated with, or resulting from the structure of the I/O pad 1312 and connectors coupled to the I/O pad 1312 or the center point 1308. The parasitic capacitance may also include gate capacitance of one or more transistors in a line receiver coupled to the I/O pad 1312 or center point 1308.

The configuration of the receiver terminating circuit 1300 limits the effect of the capacitive reactance corresponding to the parasitic capacitor 1306 with respect to a conventional line termination. The parallel arrangement of the parasitic capacitor 1306 with the second resistor 1304 produces a lower impedance ($R/2 \| X_C$) than the impedance of a combination of the parasitic capacitor 1306 with a resistor that matches the characteristic impedance ($R \| X_C$). The parallel configuration of the second resistor 1304 and the parasitic capacitor 1306 limits the mismatch effect of the parasitic capacitor 1306 on the termination impedance ($R_{term}$). The termination impedance may be calculated as:

$$R_{term}=R/2+(R/2\|X_C).$$

FIG. 13 includes an example of a transmitter terminating circuit 1320 configured in accordance with certain aspects of this disclosure. An IC device 1330 is coupled to a transmission line 1334 through the transmitter terminating circuit 1320. The transmission line 1334 may provide a single ended lane of a serial bus or parallel bus. The transmitter terminating circuit 1320 has a first resistor 1322 and a second resistor 1324 that are coupled at a center point 1328 of the transmitter terminating circuit 1320.

In the illustrated example, the first resistor 1322 is physically located outside the IC device 1330 and is configured to couple an I/O pad 1332 of the IC device 1330 to the transmission line 1334. In some examples, the first resistor 1322 is provided on a chip carrier, printed circuit board or a substrate that carries the IC device 1330. The center point 1328 of the transmitter terminating circuit 1320 lies within the IC device 1330 and is coupled to the I/O pad 1332 and to the first resistor 1322 through the I/O pad 1332. The center point 1328 may be further coupled to the output of a line driver.

The first resistor 1322 and the second resistor 1324 are connected in series and the combination terminates the transmission line 1334 through a combined resistance of R. The resistance values of the first resistor 1322 and the second resistor 1324 may be selected to match the nominal value of the characteristic impedance ($Z_0$) of the transmission line 1334. In some examples, the first resistor 1322 and the second resistor 1324 that have equal resistance values (R/2), where $R=Z_0$.

A parasitic capacitor 1326 is represented as being coupled to the center point 1328 of the series-connected first resistor 1322 and second resistor 1324. The parasitic capacitor 1326 may account for a parasitic capacitance associated with, or resulting from the structure of the I/O pad 1332 and connectors coupled to the I/O pad 1332 or the center point 1328. The parasitic capacitance may also include parasitic capacitances of a line driver coupled to the I/O pad 1332 or center point 1328.

The configuration of the transmitter terminating circuit 1320 limits the effect of the capacitive reactance corresponding to the parasitic capacitor 1326 with respect to a conventional line termination. The parallel arrangement of the parasitic capacitor 1326 with the second resistor 1324 produces a lower impedance ($R/2\|X_C$) than the impedance of a combination of the parasitic capacitor 1326 with a resistor that matches the characteristic impedance ($R\|X_C$). The parallel configuration of the second resistor 1324 and the parasitic capacitor 1326 limits the mismatch effect of the parasitic capacitor 1326 on the termination impedance.

The parallel configuration of the second resistor 1324 and the parasitic capacitor 1326 limits the mismatch effect of the parasitic capacitor 1326 on the termination impedance ($R_{term}$). The termination impedance may be calculated as:

$$R_{term}=R/2+(R/2\|X_C).$$

FIG. 14 includes tables 1400, 1420 that illustrate the effect of signaling frequency on terminating impedance and the voltage reflection coefficient (Γ) when parasitic capacitance is present at the I/O pads 1202, 1212 of FIG. 12 or the I/O pads 1312, 1332 of FIG. 13. The tables 1400, 1420 relate to a transmission line that has a 50 ohm characteristic impedance. The tables 1400, 1420 may be compared and contrasted with the tables 910 and 920 provided in FIG. 9.

Capacitive reactance may be calculated as $1/(\omega \times C)$, where ω is the angular frequency of the signal received at the termination. The first table 1400 relates to an interface in which the parasitic capacitance has a value of 1.5 pF and the second table 1420 relates to an interface in which the parasitic capacitance has a value of 1.0 pF. Each table includes reactance ($X_C$), resultant termination impedances 1402, 1422 ($R\|X_C$) and reflection coefficients 1404, 1424. The reflection coefficients 1404, 1424 show significant improvements over corresponding reflection coefficients provided in tables 910 and 920, with improvements being measurable as a factor of 3 or more.

The improved reflection coefficients 1404, 1424 reduce the reflected power on the transmission line 1210, 1314, 1334. Furthermore, each pair of the resistors 1204 and 1206, 1214 and 1216, 1302 and 1304, 1324 and 1324 is configured as a voltage divider from the perspective of the respective I/O pads 1202, 1212, 1312, 1332. The effect of the voltage dividers is to halve the amplitude of the reflections that originate at the I/O pads 1202, 1212, 1312, 1332. Reflections emanating from the I/O pads 1202, 1212, 1312, 1332 are further reduced in amplitude due to the voltage dividing effect of the impedance of the transmission line 1210, 1314, 1334 and by the first resistor 1206, 1214, 1302, 1322. Reflected signals arriving at the transmitter I/O pad 1202, 1332 are further attenuated by a voltage divider and reflected at half the amplitude of the received reflected signals. In some instances, the voltage dividers operate to quickly suppress reflected energy on the transmission line 1210, 1314, 1334.

The suppression of reflected energy and improved reflection coefficients 1404, 1424 can eliminate or minimize the resonance effects that result from multiply-reflected waveforms. The frequency response of the presently disclosed terminating circuits 1300, 1320 may approach linearity, including at frequencies of 5 GHz or more. The linearity or near-linearity of the frequency response enables conventional equalizers to obtain optimal equalization. In some instances, the receiver terminating circuit 1300 can linearize the frequency response of the channel to a variable signal frequency and the receiver terminating circuit 1300 may be used with a CTLE or other equalizer. In one example, the CTLE may be coupled to the I/O pad 1312 at the receiver when the configuration of the resistors 1302, 1304 provide a linearized frequency response to signals received at the I/O pad 1312.

Figure 15:
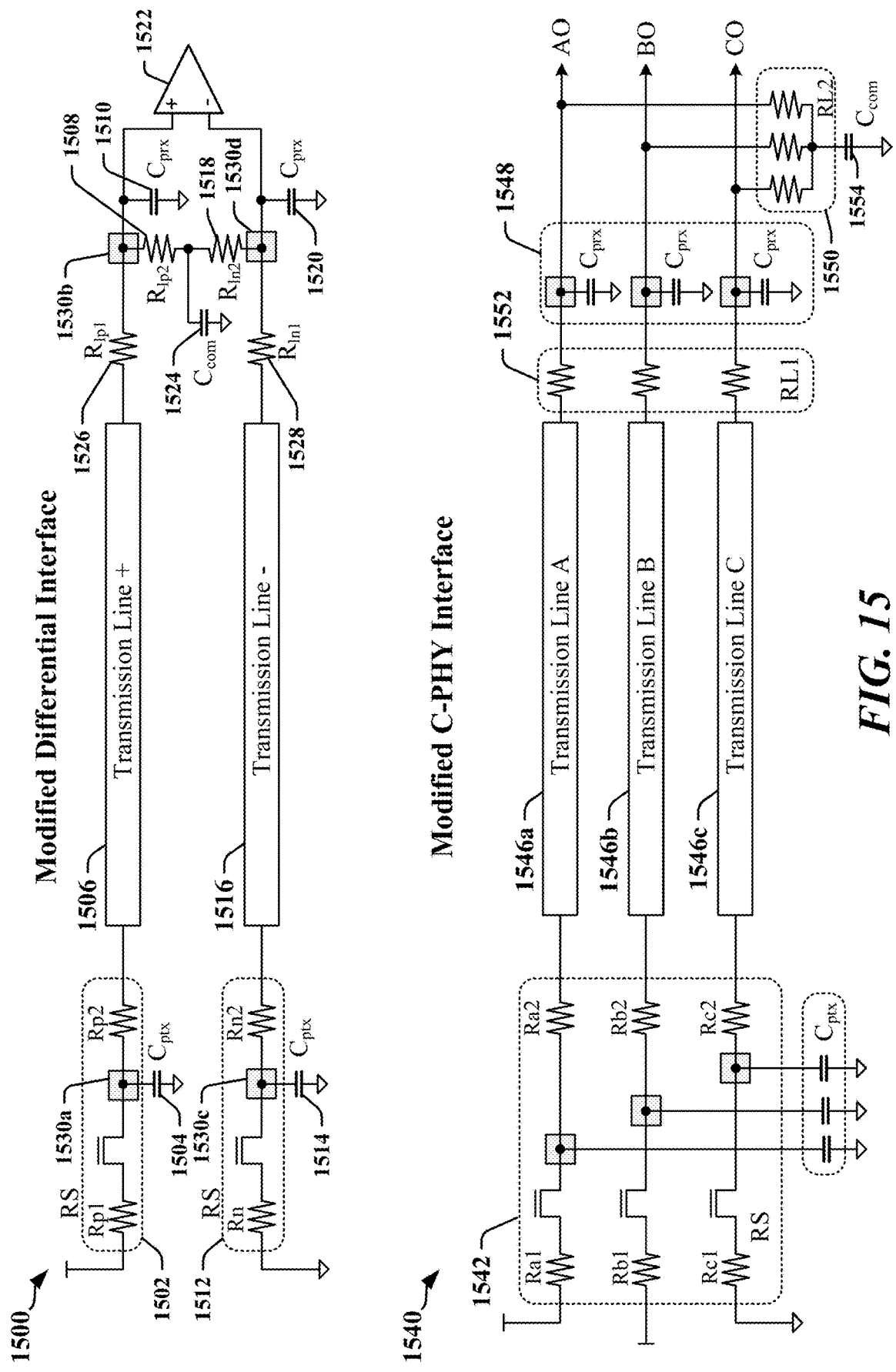
FIG. 15 illustrates two-wire and three-wire differential links adapted in accordance with certain aspects of this disclosure.

Benefits may be accrued from the use of the terminating circuits 1300, 1320 in differential communication links. FIG. 15 illustrates a two-wire differential link 1500 adapted in accordance with certain aspects of this disclosure. In the two-wire differential link 1500, a signal is transmitted in opposite-polarity versions on two physically-close wires. Each wire may be characterized as a transmission line 1506, 1516. In the illustrated example, a first transmission line 1506 is terminated by a pair of terminating resistors (RS 1502) at the transmitting end and by a pair of terminating resistors 1508, 1526 at the receiving end. At the transmitting end, the terminating resistors provide a combined resistance that matches the nominal value of the characteristic impedance of the first transmission line 1506. At the receiving end, the terminating resistors 1508, 1526 provide a combined resistance that matches the nominal value of the characteristic impedance of the first transmission line 1506. A second transmission line 1516 is terminated by a pair of terminating resistors (RS 1512) at the transmitting end and by a pair of terminating resistors 1518, 1528 at the receiving end. At the transmitting end, the terminating resistors provide a combined resistance that matches the nominal value of the characteristic impedance of the second transmission line 1516. At the receiving end, the terminating resistors 1518, 1528 provide a combined resistance that matches the nominal value of the characteristic impedance of the second transmission line 1516. Each of the I/O pads 1530*b*, 1530*d* at the receiving end is coupled to an input of a differential receiver 1522. At the receiving end, the pair of terminating resistors 1508, 1526 for the first transmission line 1506 and the pair of terminating resistors 1518, 1528 for the second transmission line 1516 are coupled a common capacitor 1524 configured to couple AC components to circuit ground. The point at which the pair of terminating resistors 1508, 1526 for the first transmission line 1506 and the pair of terminating resistors 1518, 1528 for the second transmission line 1516 are coupled provides a common mode voltage level.

The resistors in each pair of terminating resistors are coupled to one another at an I/O pad 1530*a*-1530*d* of a transmitting or receiving device. In one example, each of the terminating resistors has a resistance equal to about half the nominal value of the characteristic impedance of the transmission line 1506, 1516. Parasitic capacitances 1504, 1510, 1514, 1520 are represented as capacitors coupled to the I/O pads 1530*a*-1530*d*, which are also coupled at the center point of a pair of terminating resistors. Two terminating resistors are coupled to one another at each I/O pad 1530*a*-1530*d*. In one example, the terminating resistors each have a resistance equal to about half the nominal value of the characteristic impedance of the transmission lines 1506, 1516.

FIG. 15 also illustrates a three-wire differential link 1540, which may be used in a C-PHY interface, and which is adapted in accordance with certain aspects of this disclosure. In the C-PHY interface, a three-phase signal is transmitted in different phases on each of three wires. Each wire may be characterized as a transmission line 1546*a*, 1546*b*, 1546*c*. A set of switched resistors 1542 in the transmitter and two sets of resistors 1550, 1552 in the receiver are used to terminate respective transmission lines 1546*a*, 1546*b*, 1546*c* consistent with the terminating circuits 1300, 1320 illustrated in FIG. 13. For example, the resistors in the two sets of resistors 1550, 1552 are configured as voltage dividers that can attenuate reflections on the transmission lines 1546*a*, 1546*b*, 1546*c* including reflections from the I/O pads 1548 that may be attributable to the effect of parasitic capacitances, for example. In a C-PHY interface, zero net current is transmitted to the receiver and one end of each resistor in the set of resistors 1550 is coupled to a common capacitor 1554 that can shunt transients to circuit ground. Direct coupling to circuit ground is not required since received current and return currents are expected to cancel.

Examples of Processing Circuits and Methods

Figure 16:
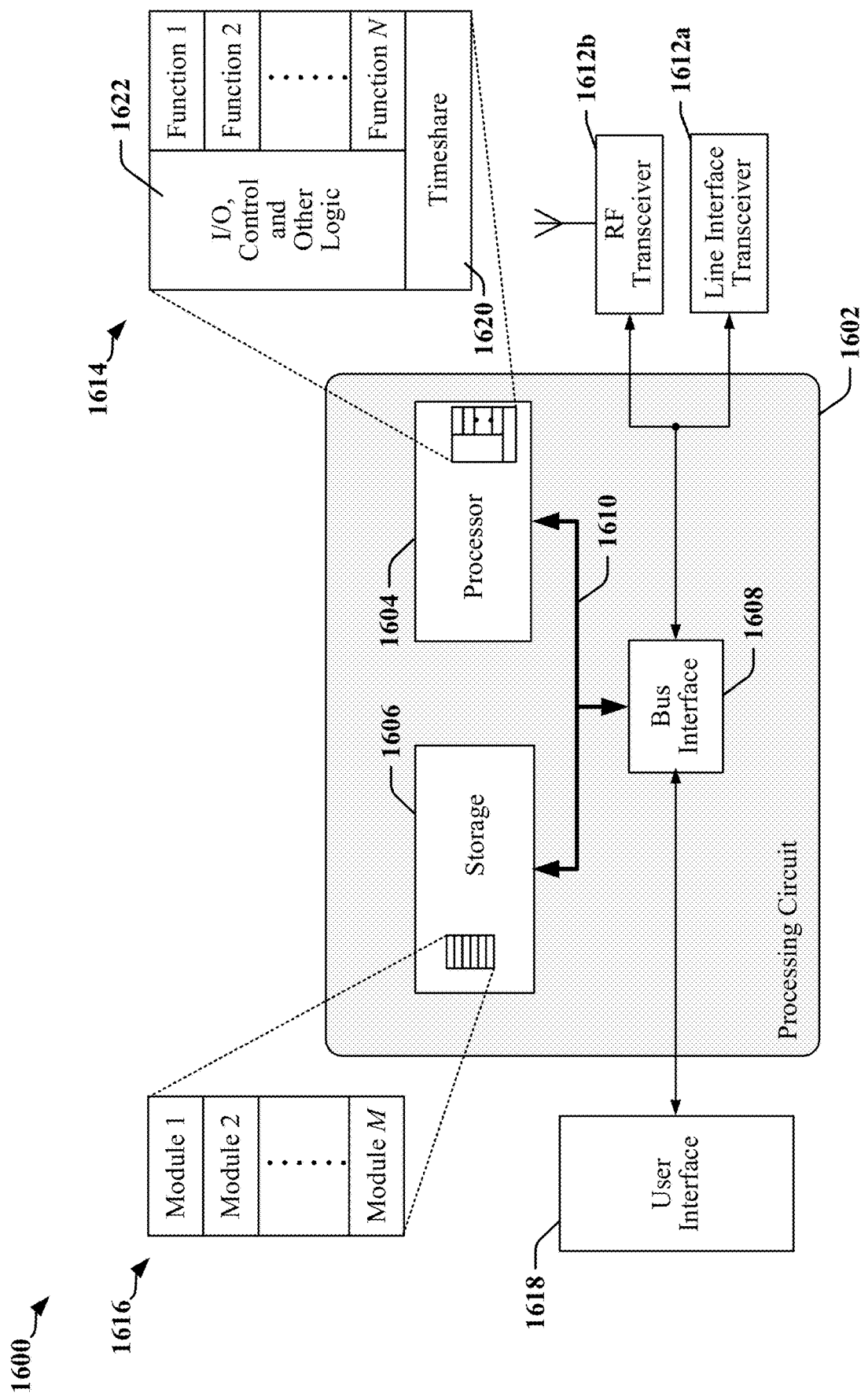
FIG. 16 illustrates one example of an apparatus employing a processing circuit that may be adapted according to certain aspects disclosed herein.

FIG. 16 is a diagram illustrating an example of a hardware implementation for an apparatus 1600. In some examples, the apparatus 1600 may perform one or more functions disclosed herein. In accordance with various aspects of the disclosure, an element, or any portion of an element, or any combination of elements as disclosed herein may be implemented using a processing circuit 1602. The processing circuit 1602 may include one or more processors 1604 that are controlled by some combination of hardware and software modules. Examples of processors 1604 include microprocessors, microcontrollers, digital signal processors (DSPs), SoCs, ASICs, field programmable gate arrays (FPGAs), programmable logic devices (PLDs), state machines, sequencers, gated logic, discrete hardware circuits, and other suitable hardware configured to perform the various functionality described throughout this disclosure. The one or more processors 1604 may include specialized processors that perform specific functions, and that may be configured, augmented or controlled by one of the software modules 1616. The one or more processors 1604 may be configured through a combination of software modules 1616 loaded during initialization, and further configured by loading or unloading one or more software modules 1616 during operation.

In the illustrated example, the processing circuit 1602 may be implemented with a bus architecture, represented generally by the bus 1610. The bus 1610 may include any number of interconnecting buses and bridges depending on the specific application of the processing circuit 1602 and the overall design constraints. The bus 1610 links together various circuits including the one or more processors 1604, and storage 1606. Storage 1606 may include memory devices and mass storage devices and may be referred to herein as computer-readable media and/or processor-readable media. The bus 1610 may also link various other circuits such as timing sources, timers, peripherals, voltage regulators, and power management circuits. A bus interface 1608 may provide an interface between the bus 1610 and one or more transceivers 1612*a*, 1612*b*. A transceiver 1612*a*, 1612*b* may be provided for each networking technology supported by the processing circuit. In some instances, multiple networking technologies may share some or all of the circuitry or processing modules found in a transceiver 1612*a*, 1612*b*. Each transceiver 1612*a*, 1612*b* provides a means for communicating with various other apparatus over a transmission medium. In one example, a transceiver 1612*a* may be used to couple the apparatus 1600 to a multi-wire bus. In another example, a transceiver 1612*b* may be used to connect the apparatus 1600 to a radio access network. Depending upon the nature of the apparatus 1600, a user interface 1618 (e.g., keypad, display, speaker, microphone, joystick) may also be provided, and may be communicatively coupled to the bus 1610 directly or through the bus interface 1608.

A processor 1604 may be responsible for managing the bus 1610 and for general processing that may include the execution of software stored in a computer-readable medium that may include the storage 1606. In this respect, the processing circuit 1602, including the processor 1604, may be used to implement any of the methods, functions and techniques disclosed herein. The storage 1606 may be used for storing data that is manipulated by the processor 1604 when executing software, and the software may be configured to implement any one of the methods disclosed herein.

One or more processors 1604 in the processing circuit 1602 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 1606 or in an external computer-readable medium. The external computer-readable medium and/or storage 1606 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, ROM, a programmable read-only memory (PROM), an erasable PROM (EPROM) including EEPROM, a register, a removable disk, and any other suitable medium for storing software and/or instructions that may be accessed and read by a computer. The computer-readable medium and/or storage 1606 may also include, by way of example, a carrier wave, a transmission line, and any other suitable medium for transmitting software and/or instructions that may be accessed and read by a computer. The computer-readable medium and/or the storage 1606 may reside in the processing circuit 1602, in the processor 1604, external to the processing circuit 1602, or be distributed across multiple entities including the processing circuit 1602. The computer-readable medium and/or storage 1606 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 1606 may maintain software maintained and/or organized in loadable code segments, modules, applications, programs, etc., which may be referred to herein as software modules 1616. Each of the software modules 1616 may include instructions and data that, when installed or loaded on the processing circuit 1602 and executed by the one or more processors 1604, contribute to a run-time image 1614 that controls the operation of the one or more processors 1604. When executed, certain instructions may cause the processing circuit 1602 to perform functions in accordance with certain methods, algorithms and processes described herein.

Some of the software modules 1616 may be loaded during initialization of the processing circuit 1602, and these software modules 1616 may configure the processing circuit 1602 to enable performance of the various functions disclosed herein. For example, some software modules 1616 may configure internal devices and/or logic circuits 1622 of the processor 1604 and may manage access to external devices such as a transceiver 1612a, 1612b, the bus interface 1608, the user interface 1618, timers, mathematical coprocessors, and so on. The software modules 1616 may include a control program and/or an operating system that interacts with interrupt handlers and device drivers, and that controls access to various resources provided by the processing circuit 1602. The resources may include memory, processing time, access to a transceiver 1612a, 1612b, the user interface 1618, and so on.

One or more processors 1604 of the processing circuit 1602 may be multifunctional, whereby some of the software modules 1616 are loaded and configured to perform different functions or different instances of the same function. The one or more processors 1604 may additionally be adapted to manage background tasks initiated in response to inputs from the user interface 1618, the transceiver 1612a, 1612b, and device drivers, for example. To support the performance of multiple functions, the one or more processors 1604 may be configured to provide a multitasking environment, whereby each of a plurality of functions is implemented as a set of tasks serviced by the one or more processors 1604 as needed or desired. In one example, the multitasking environment may be implemented using a timesharing program 1620 that passes control of a processor 1604 between different tasks, whereby each task returns control of the one or more processors 1604 to the timesharing program 1620 upon completion of any outstanding operations and/or in response to an input such as an interrupt. When a task has control of the one or more processors 1604, the processing circuit is effectively specialized for the purposes addressed by the function associated with the controlling task. The timesharing program 1620 may include an operating system, a main loop that transfers control on a round-robin basis, a function that allocates control of the one or more processors 1604 in accordance with a prioritization of the functions, and/or an interrupt driven main loop that responds to external events by providing control of the one or more processors 1604 to a handling function.

Figure 17:
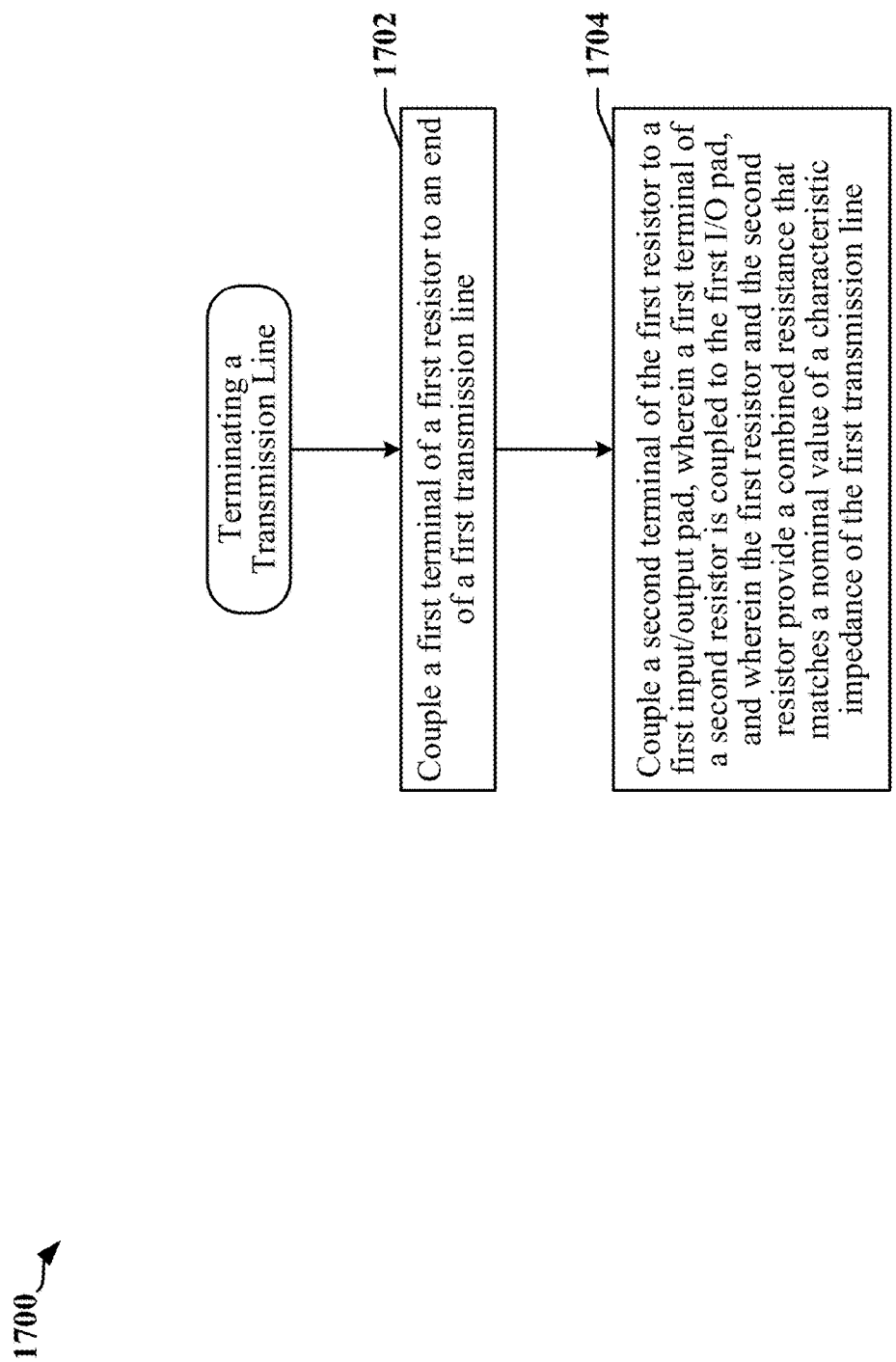
FIG. 17 is a flowchart that illustrates certain aspects disclosed herein.

FIG. 17 is a flowchart 1700 of a method of configuring a coupling between a device and a transmission line. At block 1702, a first terminal of a first resistor may be coupled to an end of a first transmission line. At block 1704, a second terminal of the first resistor may be coupled to a first I/O pad. A first terminal of a second resistor is coupled to the first I/O pad. The first resistor and the second resistor may be selected to provide a combined resistance that matches a nominal value of a characteristic impedance of the first transmission line.

In one example, an input of a receiving circuit is coupled to the first I/O pad. A second terminal of the second resistor may be coupled to circuit ground or a common mode voltage level or low-impedance rail. In another example, an output of a line driving circuit is coupled to the second terminal of the second resistor.

In certain examples, the second resistor and the first I/O pad are provided on an integrated circuit device. The first resistor and the end of the first transmission line may be located external to the integrated circuit device. Parasitic capacitance in the integrated circuit device may be measurable or manifest at the first I/O pad and the second resistor may be effectively coupled in parallel with the parasitic capacitance observed at the first I/O pad.

In certain examples, the first resistor and the second resistor form a voltage divider with the first I/O pad at the output or center of the voltage divider. Signals received at the first input/output pad may be attenuated representations of signals received at the end of the first transmission line. Reflections from the first I/O pad that are conducted to the end of the first transmission line are attenuated by the first resistor.

In certain examples, a first terminal of a third resistor is coupled to an end of a second transmission line, and a second terminal of the third resistor is coupled to a second I/O pad. A first terminal of a fourth resistor is coupled to the second I/O pad and a second terminal of the fourth resistor is coupled to a second terminal of the third resistor. The third resistor and the fourth resistor may be selected to provide a combined resistance that matches the nominal value of the characteristic impedance of the second transmission line. The first I/O pad and the second I/O pad are coupled to differential inputs of a receiver circuit. The first I/O pad and the second I/O pad are coupled through corresponding resistors to differential outputs of a driving circuit.

Figure 18:
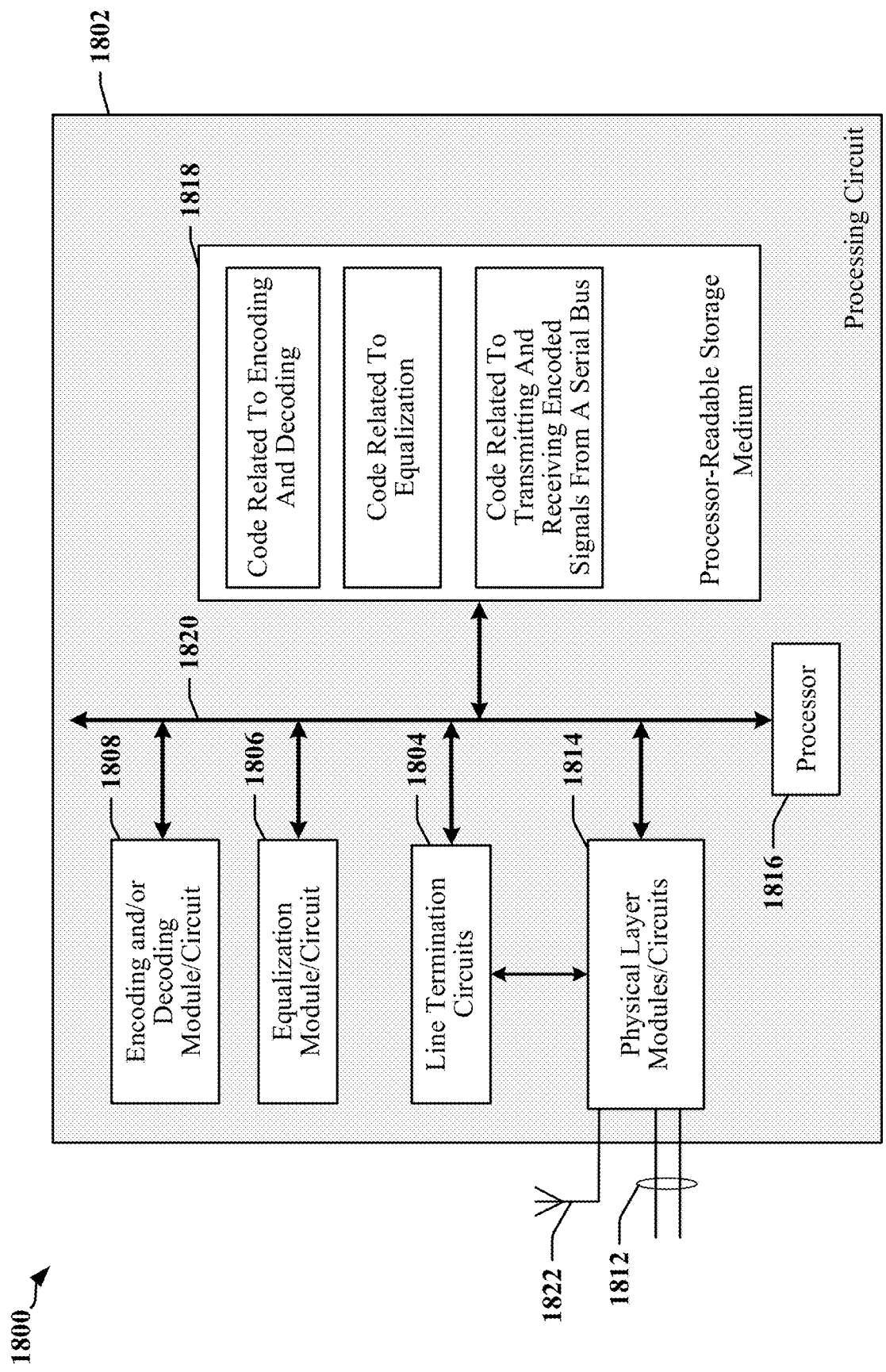
FIG. 18 illustrates an example of a hardware implementation for an apparatus adapted in accordance with certain aspects disclosed herein.

FIG. 18 is a diagram illustrating a simplified example of a hardware implementation for an apparatus 1800 employing a processing circuit 1802. The processing circuit typically has a controller or processor 1816 that may include one or more microprocessors, microcontrollers, digital signal processors, sequencers and/or state machines. The processing circuit 1802 may be implemented with a bus architecture, represented generally by the bus 1820. The bus 1820 may include any number of interconnecting buses and bridges depending on the specific application of the processing circuit 1802 and the overall design constraints. The bus 1820 links together various circuits including one or more processors and/or hardware modules, represented by the controller or processor 1816, the modules or circuits 1804, 1806 and 1808 and the processor-readable storage medium 1818. One or more physical layer circuits and/or modules 1814 may be provided to support communication over a communication link implemented using a multi-wire bus 1812, through an antenna or antenna array 1822 (to a radio access network for example), and so on. The bus 1820 may also link various other circuits such as timing sources, peripherals, voltage regulators, and power management circuits, which are well known in the art, and therefore, will not be described any further.

The processor 1816 is responsible for general processing, including the execution of software, code and/or instructions stored on the processor-readable storage medium 1818. The processor-readable storage medium 1818 may include a non-transitory storage medium. The software, when executed by the processor 1816, causes the processing circuit 1802 to perform the various functions described supra for any particular apparatus. The processor-readable storage medium 1818 may be used for storing data that is manipulated by the processor 1816 when executing software. The processing circuit 1802 further includes at least one of the modules 1804, 1806 and 1808. The modules 1804, 1806 and 1808 may be software modules running in the processor 1816, resident/stored in the processor-readable storage medium 1818, one or more hardware modules coupled to the processor 1816, or some combination thereof. The modules 1804, 1806 and 1808 may include microcontroller instructions, state machine configuration parameters, or some combination thereof.

In one configuration, the apparatus 1800 includes modules and/or circuits 1808 adapted to encode data in signals to be transmitted over a transmission line and/or to decode data from signals received from the transmission line, and modules and/or circuits 1806 configured to equalize signals received from the transmission line. The apparatus 1800 may include line termination modules and/or circuits 1804.

In some examples, portions of the line termination modules and/or circuits 1804 may be included in physical layer circuits and/or modules 1814 that implement an interface circuit adapted to couple the apparatus 1800 to a serial bus. The apparatus 1800 may have a first resistor having a first terminal coupled to an end of a first transmission line, and a second terminal coupled to a first I/O pad, and a second resistor having a first terminal coupled to the first I/O pad. The first resistor and the second resistor may be selected to provide a combined resistance that matches a nominal value of a characteristic impedance of the first transmission line. In one example, the apparatus 1800 includes a receiving circuit having an input coupled to the first I/O pad. A second terminal of the second resistor may be coupled to circuit ground or a common mode voltage level. In another example, the apparatus 1800 may include a line driving circuit having an output coupled to the second terminal of the second resistor.

In certain examples, the second resistor and the first I/O pad are provided on an IC device. The first resistor and the end of the first transmission line may be located external to the IC device. Parasitic capacitance in the integrated circuit device may be measurable or manifest at the first I/O pad and the second resistor may be effectively coupled in parallel with the parasitic capacitance observed at the first I/O pad.

In certain examples, the first resistor and the second resistor form a voltage divider with the first I/O pad at the center of the voltage divider. Signals received at the first I/O pad are attenuated representations of signals received at the end of the first transmission line. Reflections from the first I/O pad and conducted to the end of the first transmission line are attenuated by the first resistor.

In some examples, the apparatus 1800 includes a CTLE coupled to the first I/O pad. The first resistor and the second resistor may be configured as a frequency response linearizing terminating circuit.

In some examples, the apparatus 1800 includes a third resistor having a first terminal coupled to an end of a second transmission line, and a second terminal coupled to a second I/O pad and a fourth resistor having a first terminal coupled to the second I/O pad and a second terminal coupled to a second terminal of the second resistor. The third resistor and the fourth resistor may be selected to provide a combined resistance that matches the nominal value of the characteristic impedance of the second transmission line. In one example, the first I/O pad and the second I/O pad are coupled to differential inputs of a receiver circuit. In another example, the first I/O pad and the second I/O pad are coupled through corresponding resistors to differential outputs of a driving circuit.

In some examples, the apparatus 1800 is included in a system that has a data communication link, a first IC device coupled to a first end of the data communication link through a first terminating circuit and a second integrated circuit device coupled to a second end of the data communication link through a second terminating circuit. The first terminating circuit may include a first resistor having a first terminal coupled to a first end of a first transmission line in the data communication link, and a second terminal coupled to a first I/O pad. The first terminating circuit may include a second resistor having a first terminal coupled to the first I/O pad and a receiving circuit having a first input coupled to the first I/O pad. A second terminal of the second resistor may be coupled to circuit ground or a common mode voltage level. The resistor and the second resistor may be selected to provide a combined resistance that matches a nominal value of a characteristic impedance of the first transmission line.

In one example, the second resistor and the first I/O pad are provided on the first IC device. The first resistor and the first end of the first transmission line may be located external to the first integrated circuit device. Parasitic capacitance in the integrated circuit device may be measurable or manifest at the first I/O pad and the second resistor may be effectively coupled in parallel with the parasitic capacitance observed at the first I/O pad.

In some examples, the first resistor and the second resistor form a voltage divider with the first I/O pad at the center of the voltage divider. Signals received at the first I/O pad are attenuated representations of signals received at the first end of the first transmission line. Reflections from the first I/O pad that are conducted to the first end of the first transmission line may be attenuated through the first resistor.

In one example, a CTLE equalizer is coupled to the first I/O pad. The first resistor and the second resistor may be configured as a frequency response linearizing terminating circuit.

In one example, the data communication link includes a second transmission line. The first terminating circuit may include a third resistor having a first terminal coupled to an end of the second transmission line and a second terminal coupled to a second I/O pad. The first terminating circuit may include a fourth resistor having a first terminal coupled to the second I/O pad and a second terminal coupled to a second terminal of the second resistor. The third resistor and the fourth resistor may provide a combined resistance that matches the nominal value of the characteristic impedance of the second transmission line. The first I/O pad may be coupled to a second input of the receiver circuit. The receiving circuit may include or operate as a differential receiver.

In one example, the second terminating circuit includes a fifth resistor having a first terminal coupled to a second end of the first transmission line, and a second terminal coupled to a third I/O pad. The second terminating circuit may include a sixth resistor having a first terminal coupled to the third I/O pad, and a line driving circuit having an output coupled to the second terminal of the sixth resistor. The fifth resistor and the sixth resistor may provide a combined resistance that matches a nominal value of a characteristic impedance of the first transmission line. The line driving circuit may include or operate as a differential line driver.

Some implementation examples are described in the following numbered clauses:

1. An apparatus comprising: a first resistor having a first terminal coupled to an end of a first transmission line, and a second terminal coupled to a first input/output pad; and a second resistor having a first terminal coupled to the first input/output pad, wherein the first resistor and the second resistor provide a combined resistance that matches a nominal value of a characteristic impedance of the first transmission line.
2. The apparatus of claim 1, further comprising: a receiving circuit having an input coupled to the first input/output pad, wherein a second terminal of the second resistor is coupled to circuit ground or a common mode voltage level.
3. The apparatus of claim 1, further comprising: a line driving circuit having an output coupled to a second terminal of the second resistor.
4. The apparatus of any of claims 1-3, wherein the second resistor and the first input/output pad are provided on an integrated circuit device, and wherein the first resistor and the end of the first transmission line are located external to the integrated circuit device.
5. The apparatus of any of claims 1-4, wherein the first resistor and the second resistor form a voltage divider with the first input/output pad coupled to an output of the voltage divider, and wherein signals received at the first input/output pad are attenuated representations of signals received at the end of the first transmission line.
6. The apparatus of claim 5, wherein reflections from the first input/output pad that are conducted to the end of the first transmission line are attenuated by the first resistor.
7. The apparatus of any of claims 1-6, further comprising: a continuous time linear equalizer coupled to the first input/output pad, wherein the first resistor and the second resistor are configured as a frequency response linearizing terminating circuit.
8. The apparatus of any of claims 1-7, further comprising: a third resistor having a first terminal coupled to an end of a second transmission line, and a second terminal coupled to a second input/output pad; and a fourth resistor having a first terminal coupled to the second input/output pad and a second terminal coupled to a second terminal of the second resistor, wherein the third resistor and the fourth resistor provide a combined resistance that matches the nominal value of the characteristic impedance of the second transmission line.
9. The apparatus of claim 8, wherein the first input/output pad and the second input/output pad are coupled to differential inputs of a receiver circuit.
10. The apparatus of claim 8, wherein the first input/output pad and the second input/output pad are coupled through corresponding resistors to differential outputs of a driving circuit.
11. A system for data communication comprising: a data communication link comprising a first transmission line; a first integrated circuit device coupled to a first end of the data communication link through a first terminating circuit; and a second integrated circuit device coupled to a second end of the data communication link through a second terminating circuit, wherein the first terminating circuit comprises: a first resistor having a first terminal coupled to a first end of the first transmission line, and a second terminal coupled to a first input/output pad; a second resistor having a first terminal coupled to the first input/output pad; and a receiving circuit having a first input coupled to the first input/output pad, wherein a second terminal of the second resistor is coupled to circuit ground or a common mode voltage level, and wherein the first resistor and the second resistor provide a combined resistance that matches a nominal value of a characteristic impedance of the first transmission line.
12. The system of claim 11, wherein the second resistor and the first input/output pad are provided within the first integrated circuit device, and wherein the second resistor and the first end of the first transmission line are located external to the first integrated circuit device.
13. The system of claim 11 or claim 12, wherein the first resistor and the second resistor form a voltage divider with the first input/output pad coupled to an output of the voltage divider, and wherein signals received at the first input/output pad are attenuated representations of signals received at the first end of the first transmission line.
14. The system of claim 13, wherein reflections from the first input/output pad that are conducted to the first end of the first transmission line are attenuated by the first resistor.
15. The system of any of claims 11-14, further comprising: a continuous time linear equalizer coupled to the first input/output pad, wherein the first resistor and the second resistor are configured as a frequency response linearizing terminating circuit.
16. The system of any of claims 11-15, wherein the data communication link comprises a second transmission line and wherein the first terminating circuit further comprises: a third resistor having a first terminal coupled to an end of the second transmission line, and a second terminal coupled to a second input/output pad; and a fourth resistor having a first terminal coupled to the second input/output pad and a second terminal coupled to a second terminal of the second resistor, wherein the third resistor and the fourth resistor provide a combined resistance that matches the nominal value of the characteristic impedance of the second transmission line, and wherein the first input/output pad is coupled to a second input of the receiver circuit, wherein the receiving circuit comprises a differential receiver.
17. The system of any of claims 11-16, wherein the second terminating circuit comprises: a fifth resistor having a first terminal coupled to a second end of the first transmission line, and a second terminal coupled to a third input/output pad; a sixth resistor having a first terminal coupled to the third input/output pad; and a line driving circuit having an output coupled to the second terminal of the sixth resistor, wherein the fifth resistor and the sixth resistor provide a combined resistance that matches a nominal value of a characteristic impedance of the first transmission line.

18. The system of claim 17, wherein the line driving circuit comprises a differential line driver.

19. A method of terminating transmission lines, comprising: coupling a first terminal of a first resistor to an end of a first transmission line; and coupling a second terminal of the first resistor to a first input/output pad, wherein a first terminal of a second resistor is coupled to the first input/output pad, and wherein the first resistor and the second resistor provide a combined resistance that matches a nominal value of a characteristic impedance of the first transmission line.

20. The method of claim 19, wherein an input of a receiving circuit is coupled to the first input/output pad, and wherein a second terminal of the second resistor is coupled to circuit ground or a common mode voltage level.

21. The method of claim 20, wherein an output of a line driving circuit is coupled to the second terminal of the second resistor.

22. The method of any of claims 19-21, wherein the second resistor and the first input/output pad are provided on an integrated circuit device, and wherein the first resistor and the end of the first transmission line are located external to the integrated circuit device.

23. The method of any of claims 19-22, wherein the first resistor and the second resistor form a voltage divider with the first input/output pad coupled to an output of the voltage divider, and wherein signals received at the first input/output pad are attenuated representations of signals received at the end of the first transmission line.

24. The method of claim 23, wherein reflections from the first input/output pad that are conducted to the end of the first transmission line are attenuated by the first resistor.

25. The method of any of claims 19-24, further comprising: coupling a first terminal of a third resistor to an end of a second transmission line; and coupling a second terminal of the third resistor to a second input/output pad, wherein a first terminal of a fourth resistor is coupled to the second input/output pad and a second terminal of the fourth resistor is coupled to a second terminal of the third resistor, wherein the third resistor and the fourth resistor provide a combined resistance that matches the nominal value of the characteristic impedance of the second transmission line.

26. The method of claim 25, wherein the first input/output pad and the second input/output pad are coupled to differential inputs of a receiver circuit.

27. The method of claim 25, wherein the first input/output pad and the second input/output pad are coupled through corresponding resistors to differential outputs of a driving circuit.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus comprising:
   a first resistor having a first terminal coupled to an end of a first transmission line, and a second terminal coupled to a first input/output pad;
   a second resistor having a first terminal coupled to the first input/output pad, wherein the first resistor and the second resistor provide a combined resistance that matches a nominal value of a characteristic impedance of the first transmission line;
   a third resistor having a first terminal coupled to an end of a second transmission line, and a second terminal coupled to a second input/output pad; and
   a fourth resistor having a first terminal coupled to the second input/output pad and a second terminal coupled to a second terminal of the second resistor, wherein the third resistor and the fourth resistor provide a combined resistance that matches the nominal value of the characteristic impedance of the second transmission line.

2. The apparatus of claim 1, further comprising:
   a receiving circuit having an input coupled to the first input/output pad, wherein a second terminal of the second resistor is coupled to circuit ground or a common mode voltage level.

3. The apparatus of claim 1, further comprising:
   a line driving circuit having an output coupled to a second terminal of the second resistor.

4. The apparatus of claim 1, wherein the second resistor and the first input/output pad are provided on an integrated circuit device, and wherein the first resistor and the end of the first transmission line are located external to the integrated circuit device.

5. The apparatus of claim 1, wherein the first resistor and the second resistor form a voltage divider with the first input/output pad coupled to an output of the voltage divider, and wherein signals received at the first input/output pad are attenuated representations of signals received at the end of the first transmission line.

6. The apparatus of claim 5, wherein reflections from the first input/output pad that are conducted to the end of the first transmission line are attenuated by the first resistor.

7. The apparatus of claim 1, further comprising:
a continuous time linear equalizer coupled to the first input/output pad, wherein the first resistor and the second resistor are configured as a frequency response linearizing terminating circuit.

8. The apparatus of claim 1, wherein the first input/output pad and the second input/output pad are coupled to differential inputs of a receiver circuit.

9. The apparatus of claim 1, wherein the first input/output pad and the second input/output pad are coupled through corresponding resistors to differential outputs of a driving circuit.

10. A system for data communication comprising:
a data communication link comprising a first transmission line and a second transmission line;
a first integrated circuit device coupled to a first end of the data communication link through a first terminating circuit; and
a second integrated circuit device coupled to a second end of the data communication link through a second terminating circuit,
wherein the first terminating circuit comprises:
a first resistor having a first terminal coupled to a first end of the first transmission line, and a second terminal coupled to a first input/output pad;
a second resistor having a first terminal coupled to the first input/output pad;
a receiving circuit having a first input coupled to the first input/output pad, wherein a second terminal of the second resistor is coupled to circuit ground or a common mode voltage level, and wherein the first resistor and the second resistor provide a combined resistance that matches a nominal value of a characteristic impedance of the first transmission line;
a third resistor having a first terminal coupled to an end of the second transmission line, and a second terminal coupled to a second input/output pad; and
a fourth resistor having a first terminal coupled to the second input/output pad and a second terminal coupled to a second terminal of the third resistor, wherein the third resistor and the fourth resistor provide a combined resistance that matches the nominal value of the characteristic impedance of the second transmission line.

11. The system of claim 10, wherein the second resistor and the first input/output pad are provided within the first integrated circuit device, and wherein the first resistor and the first end of the first transmission line are located external to the first integrated circuit device.

12. The system of claim 10, wherein the first resistor and the second resistor form a voltage divider with the first input/output pad coupled to an output of the voltage divider, and wherein signals received at the first input/output pad are attenuated representations of signals received at the first end of the first transmission line.

13. The system of claim 12, wherein reflections from the first input/output pad that are conducted to the first end of the first transmission line are attenuated by the first resistor.

14. The system of claim 10, further comprising:
a continuous time linear equalizer coupled to the first input/output pad, wherein the first resistor and the second resistor are configured as a frequency response linearizing terminating circuit.

15. The system of claim 10,
wherein the first input/output pad is coupled to an input of a differential receiver.

16. The system of claim 10, wherein the second terminating circuit comprises:
a fifth resistor having a first terminal coupled to a second end of the first transmission line, and a second terminal coupled to a third input/output pad;
a sixth resistor having a first terminal coupled to the third input/output pad; and
a line driving circuit having an output coupled to the second terminal of the sixth resistor,
wherein the fifth resistor and the sixth resistor provide a combined resistance that matches a nominal value of a characteristic impedance of the first transmission line.

17. The system of claim 16, wherein the line driving circuit comprises a differential line driver.

18. A method of terminating transmission lines, comprising:
coupling a first terminal of a first resistor to an end of a first transmission line;
coupling a second terminal of the first resistor to a first input/output pad, wherein a first terminal of a second resistor is coupled to the first input/output pad, and wherein the first resistor and the second resistor provide a combined resistance that matches a nominal value of a characteristic impedance of the first transmission line;
coupling a first terminal of a third resistor to an end of a second transmission line; and
coupling a second terminal of the third resistor to a second input/output pad, wherein a first terminal of a fourth resistor is coupled to the second input/output pad and a second terminal of the fourth resistor is coupled to a second terminal of the third resistor, and wherein the third resistor and the fourth resistor provide a combined resistance that matches the nominal value of the characteristic impedance of the second transmission line.

19. The method of claim 18, wherein an input of a receiving circuit is coupled to the first input/output pad, and wherein a second terminal of the second resistor is coupled to circuit ground or a common mode voltage level.

20. The method of claim 18, wherein an output of a line driving circuit is coupled to the second terminal of the second resistor.

21. The method of claim 18, wherein the second resistor and the first input/output pad are provided on an integrated circuit device, and wherein the first resistor and the end of the first transmission line are located external to the integrated circuit device.

22. The method of claim 18, wherein the first resistor and the second resistor form a voltage divider with the first input/output pad coupled to an output of the voltage divider, and wherein signals received at the first input/output pad are attenuated representations of signals received at the end of the first transmission line.

23. The method of claim 22, wherein reflections from the first input/output pad that are conducted to the end of the first transmission line are attenuated by the first resistor.

24. The method of claim 18, wherein the first input/output pad and the second input/output pad are coupled to differential inputs of a receiver circuit.

25. The method of claim 18, wherein the first input/output pad and the second input/output pad are coupled through corresponding resistors to differential outputs of a driving circuit.

* * * * *